United States Patent
Nagai

(10) Patent No.: US 9,479,074 B2
(45) Date of Patent: Oct. 25, 2016

(54) RESONANCE COUPLER, TRANSMISSION APPARATUS, SWITCHING SYSTEM, AND DIRECTIONAL COUPLER

(71) Applicant: Panasonic Intellectual Property Management Co., Ltd., Osaka (JP)

(72) Inventor: Shuichi Nagai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 2 days.

(21) Appl. No.: 14/601,518

(22) Filed: Jan. 21, 2015

(65) Prior Publication Data

US 2015/0214597 A1    Jul. 30, 2015

(30) Foreign Application Priority Data

Jan. 29, 2014 (JP) ................ 2014-014497

(51) Int. Cl.

| | |
|---|---|
| *H01P 5/02* | (2006.01) |
| *H02M 5/293* | (2006.01) |
| *H03K 17/56* | (2006.01) |
| *H01P 5/18* | (2006.01) |
| *H02M 1/08* | (2006.01) |
| *H01P 7/08* | (2006.01) |

(52) U.S. Cl.
CPC .............. *H02M 5/293* (2013.01); *H01P 5/187* (2013.01); *H02M 1/08* (2013.01); *H03K 17/56* (2013.01); *H02M 2005/2932* (2013.01)

(58) Field of Classification Search
CPC ............ H01P 5/18; H01P 7/08; H01P 7/084; H01P 3/08; H01P 3/085; H01P 1/20381
USPC .......... 333/109, 110, 111, 112, 116, 119, 25, 333/204, 238
See application file for complete search history.

(56) References Cited

U.S. PATENT DOCUMENTS

| | | | | |
|---|---|---|---|---|
| 4,264,881 A | * | 4/1981 | De Ronde | H01P 7/082 331/107 SL |
| 4,469,976 A | * | 9/1984 | Scott | G10K 11/32 310/334 |
| 5,424,694 A | * | 6/1995 | Maloratsky | H01P 5/185 333/112 |
| 5,629,266 A | * | 5/1997 | Lithgow | H01P 1/20 333/202 |
| 5,917,386 A | * | 6/1999 | Dobrovolny | H01F 17/0006 333/119 |
| 6,281,769 B1 | * | 8/2001 | Fiedziuszko | H01P 1/203 333/239 |
| 6,700,303 B2 | * | 3/2004 | Ando | B06B 1/0611 310/320 |
| 6,759,922 B2 | * | 7/2004 | Adar | H03F 3/602 333/109 |

(Continued)

FOREIGN PATENT DOCUMENTS

| | | |
|---|---|---|
| JP | 2008-067012 | 3/2008 |
| WO | 2008/062800 | 5/2008 |
| WO | 2013/065254 | 5/2013 |

*Primary Examiner* — Dean Takaoka
(74) *Attorney, Agent, or Firm* — McDermott Will & Emery LLP

(57) ABSTRACT

A resonance coupler disclosed includes a first resonator to which a transmission signal is input, a second resonator to which the transmission signal is isolatedly transmitted from the first resonator, the second resonator spaced from and opposed to a first side of the first resonator, and electromagnetically coupled with the first resonator, and a third resonator to which the transmission signal is isolatedly transmitted from the first resonator, the third resonator spaced from and opposed to a second side, opposite to the first side, of the first resonator, and electromagnetically coupled with the first resonator.

16 Claims, 14 Drawing Sheets

(56) References Cited

U.S. PATENT DOCUMENTS

| | | | | |
|---|---|---|---|---|
| 6,927,647 B2* | 8/2005 | Starri | H01P 1/15 | 333/103 |
| 6,972,638 B2* | 12/2005 | Usami | H01P 5/185 | 333/109 |
| 7,253,701 B2* | 8/2007 | Smith | H01P 1/2135 | 333/100 |
| 7,468,640 B2* | 12/2008 | Nosaka | H01P 5/10 | 333/25 |
| 7,605,672 B2* | 10/2009 | Kirkeby | H01P 5/10 | 333/112 |
| 7,619,495 B2* | 11/2009 | Albacete | H01P 1/20381 | 333/118 |
| 7,710,216 B2* | 5/2010 | Hamada | H01P 5/10 | 333/128 |
| 7,868,718 B2* | 1/2011 | Yasuda | H01P 1/20381 | 333/204 |
| 8,044,751 B2* | 10/2011 | Tsai | H01P 1/20372 | 333/205 |
| 8,143,976 B2* | 3/2012 | Wyland | H01L 23/66 | 333/260 |
| 8,493,277 B2* | 7/2013 | Lam | H01P 1/20 | 333/219.1 |
| 8,558,635 B2* | 10/2013 | Jeong | H01P 5/10 | 333/238 |
| 8,576,026 B2* | 11/2013 | Liu | H03H 7/09 | 333/204 |
| 9,331,372 B2* | 5/2016 | Fackelmeier | H01P 5/18 | |
| 2010/0097105 A1 | 4/2010 | Morita et al. | | |
| 2013/0154765 A1* | 6/2013 | Chuang | H01P 1/20381 | 333/177 |
| 2014/0049297 A1 | 2/2014 | Nagai et al. | | |

* cited by examiner

RESONANCE COUPLER, TRANSMISSION APPARATUS, SWITCHING SYSTEM, AND DIRECTIONAL COUPLER

CROSS REFERENCES TO RELATED APPLICATIONS

This Application claims priority to Japanese Patent Application No. 2014-014497, filed on Jan. 29, 2014, the contents of which are hereby incorporated by reference.

BACKGROUND

1. Technical Field

The present disclosure relates to, for example, a resonance coupler, a transmission apparatus, a switching system, and a directional coupler.

2. Description of the Related Art

A gate driving circuit controls turning-on/off of a semiconductor switching device by applying a gate voltage to a gate terminal of the semiconductor switching device. The gate driving circuit applies a gate voltage to a gate terminal of a high voltage switching device.

Japanese Patent No. 5552230 discloses a bidirectional switch using a GaN semiconductor. When the bidirectional switch is in an ON-state, the bidirectional switch allows a current to pass through it in either direction between two terminals. When the bidirectional switch is in an OFF-state, the bidirectional switch is capable of cutting off the current.

A device that isolates a DC component between a primary side and a secondary side is called a signal isolation device or a non-contact signal transmitter. The signal isolation device is an indispensable device to drive a high voltage switching device.

Japanese Unexamined Patent Application Publication No. 2008-067012 discloses an open ring type electromagnetic resonance coupler capable of isolatedly transmitting a gate signal and power.

SUMMARY

There is a need for a signal isolation device capable of performing isolated transmission with a low transmission loss. One non-restricting and exemplary embodiment provides a resonance coupler capable of splitting a transmission signal into a plurality of signals and isolatedly transmitting them with a low transmission loss.

Additional benefits and advantages of the disclosed embodiments will be apparent from the specification and drawings. The benefits and/or advantages may be individually provided by the various embodiments and features of the specification and drawings disclosure, and need not all be provided in order to obtain one or more of the same.

In one aspect of the present disclosure, the techniques disclosed here feature a resonance coupler that includes: a first resonator to which a transmission signal is input; a second resonator to which the transmission signal is isolatedly transmitted from the first resonator; the second resonator spaced from and opposed to a first side of the first resonator, and electromagnetically coupled with the first resonator; and a third resonator to which the transmission signal is isolatedly transmitted from the first resonator, the third resonator spaced from and opposed to a second side, opposite to the first side, of the first resonator, and electromagnetically coupled with the first resonator.

These comprehensive and specific aspects may be implemented using a resonator, a transmission apparatus, a switching system, a directional coupler, a manufacturing method, a transmission method, and any combination thereof.

A resonance coupler according to the disclosure is capable of splitting a transmission signal into a plurality of signals and isolatedly transmitting them with a low transmission loss.

DETAILED DESCRIPTION

Overview of Embodiments

Figure 1:
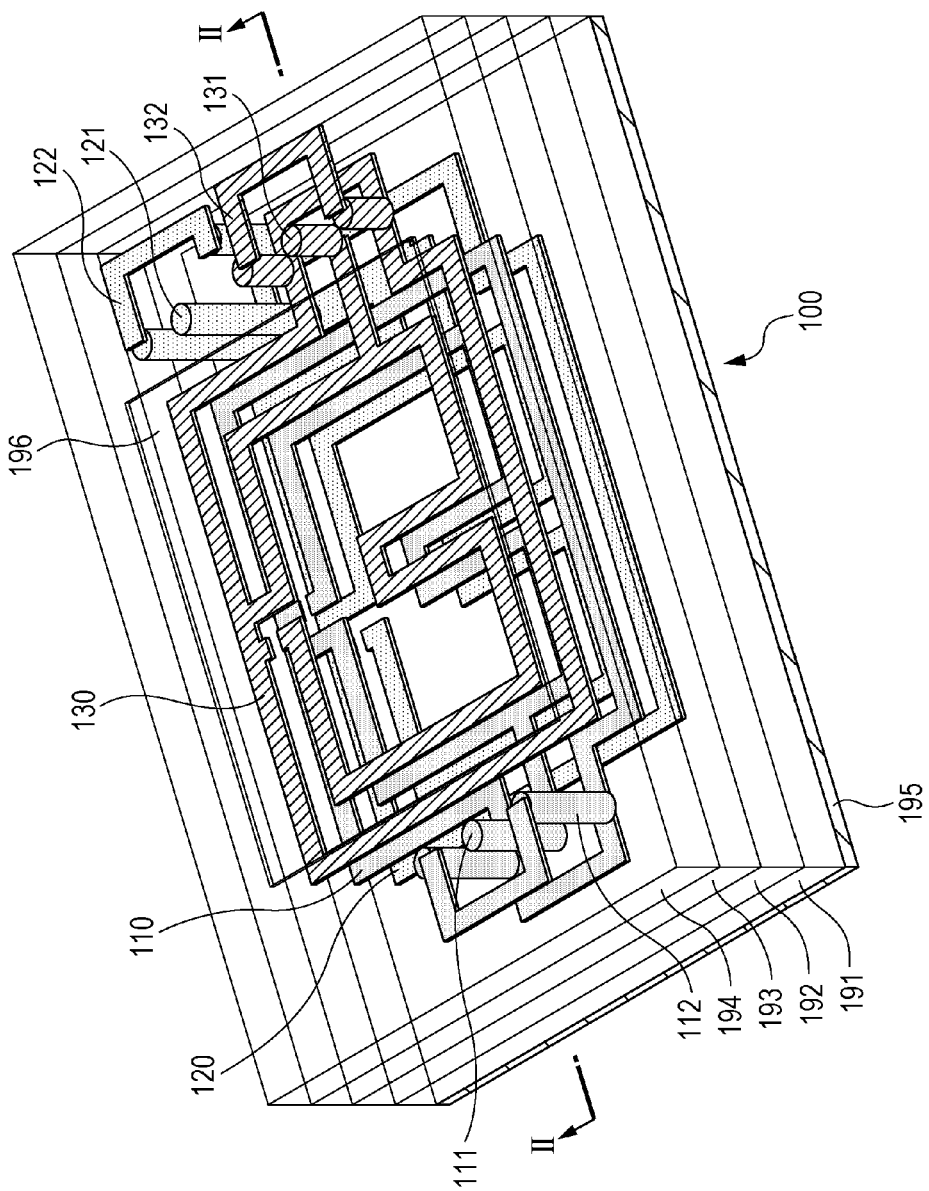
FIG. 1 is a perspective view illustrating an example of a structure of a resonance coupler according to an embodiment.

According to an aspect of the present disclosure, a resonance coupler includes: a first resonator to which a transmission signal is input; a second resonator to which the transmission signal is isolatedly transmitted from the first resonator, the second resonator spaced from and opposed to a first side of the first resonator, and electromagnetically coupled with the first resonator; and a third resonator to which the transmission signal is isolatedly transmitted from the first resonator, the third resonator spaced from and opposed to a second side, opposite to the first side, of the first resonator, and electromagnetically coupled with the first resonator.

The resonance coupler according to this aspect is capable of splitting the transmission signal into a plurality of signals and isolatedly transmitting them with a low transmission loss.

In this resonance coupler according to the aspect of the disclosure, for example, the second resonator may be disposed in a second plane area, the first resonator may be disposed in a first plane area, and the third resonator may be disposed in a third plane area, wherein the second plane area, the first plane area, and the third plane area may be overlaid in this order.

Note that each plane area may be a space region having a finite thickness. For example, when wirings in the resonance coupler have a thickness, each plane area may have a thickness corresponding to the thickness of the wirings. When part of wirings in the resonance coupler has a three-dimensional structure, the plane area may be a space region including the three-dimensional structure.

In the resonance coupler according to the aspect of the disclosure, for example, the transmission signal may be a high-frequency signal, the first resonator may include a first loop wiring having an open loop shape, the second resonator may include a second loop wiring having an open loop shape, and the third resonator may include a third loop wiring having an open loop shape.

This resonance coupler having the structure described above is capable of splitting the transmission signal into a plurality of signals and isolatedly transmitting them with a low transmission loss. Furthermore, the resonance coupler can be downsized.

In the resonance coupler according to the aspect of the disclosure, for example, the second resonator may be spaced from the first resonator by a distance equal to or less than twice a loop length of the first loop wiring, and the third resonator may be spaced from the first resonator by a distance equal to or less than twice the loop length of the first loop wiring.

By configuring the resonance coupler in the above-described manner, it becomes possible to achieve a reduction in the size of the resonance coupler.

In the resonance coupler according to the aspect of the disclosure, for example, the first loop wiring, the second loop wiring, and the third loop wiring may have an identical shape.

By configuring the resonance coupler in the above-described manner, it becomes possible to achieve a reduction in the size of the resonance coupler. Note that the shape may be regarded as being identical even when a difference in shape or a positioning error occurs during a production process as long as the shape difference or the positioning error is within a tolerance. Furthermore, when wiring shapes are point-symmetric or inversion-symmetric, such wiring shapes are also regarded as being identical.

In the resonance coupler according to the aspect of the disclosure, for example, the first resonator may include an input terminal electrically connected to the first loop wiring, the second resonator may include an output terminal electrically connected to the second loop wiring, and the third resonator may include another output terminal electrically connected to the third loop wiring.

In the resonance coupler according to the aspect of the disclosure, for example, the first resonator may include a first reference terminal electrically connected to one end of the first loop wiring, the second resonator may include a second reference terminal electrically connected to one end of the second loop wiring, and the third resonator may include a third reference terminal electrically connected to one end of the third loop wiring.

By configuring the resonance coupler in the above-described manner, it becomes possible to achieve a reduction in the size of the resonance coupler while maintaining an operating frequency of the resonance coupler.

In the resonance coupler according to the aspect of the disclosure, for example, the first resonator may further include a first outer loop wiring surrounding the first loop wiring, the first outer loop electrically connected to the first reference terminal.

By configuring the resonance coupler in the above-described manner, it is possible to improve the transmission characteristic. Note that in the term "the first outer loop wiring surrounding the first loop wiring", the first outer loop wiring does not necessarily need to form a closed loop, but the first outer loop wiring may have an open end.

In this resonance coupler according to the aspect of the disclosure, for example, the second resonator may further include a second outer loop wiring surrounding the second loop wiring and electrically connected to the second reference terminal, and the third resonator may further include a third outer loop wiring surrounding the third loop wiring and electrically connected to the third reference terminal.

By configuring the resonance coupler in the above-described manner, it is possible to improve the transmission characteristic. Note that in the term "the second outer loop wiring surrounding the second loop wiring", the second outer loop wiring does not necessarily need to form a closed loop, but the second outer loop wiring may have an open end. Similarly, the third outer loop wiring may have an open end.

The resonance coupler according to the aspect of the disclosure, for example, may further includes a first ground part that opposes a side of the second resonator, the side not opposing the first resonator, and that covers the second loop wiring.

By configuring the resonance coupler in the above-described manner, it is possible to improve resistance to external noise. Furthermore, it is possible to suppress unnecessary irradiation.

The resonance coupler according to the aspect of the disclosure, for example, may further includes a second ground part that opposes a side of the third resonator, the side not opposing the first resonator, and that covers the third loop wiring.

By configuring the resonance coupler in the above-described manner, it is possible to improve resistance to external noise. Furthermore, it is possible to suppress unnecessary irradiation.

The resonance coupler according to the aspect of the disclosure, for example, may further includes: a first ground part that opposes a side of the second resonator, the side not opposing the first resonator, and that covers the second loop wiring; a second ground part that opposes a side of the third resonator, the side not opposing the first resonator, and that covers the third loop wiring, and wherein the first ground part may be electrically connected to the second reference terminal, and the second ground part may be electrically connected to the third reference terminal.

By configuring the resonance coupler in the above-described manner, it becomes possible to achieve a reduction in the size of the resonance coupler.

In the resonance coupler according to the aspect of the disclosure, for example, the distance between the first resonator and the second resonator may be different from the distance between the first resonator and the third resonator.

By configuring the resonance coupler in the above-described manner, it is possible to set a power distribution ratio to be different between a signal output from the second resonator and a signal output from the third resonator.

The resonance coupler according to the aspect of the disclosure, for example, may further include a first substrate on which the second plane area is located, a second substrate on which the first plane area is located, and a third substrate on which the third plane area is located, wherein the first substrate, the second substrate and the third substrate may be laminated in this order.

By configuring the resonance coupler in the above-described manner, it becomes possible to achieve a reduction in the size of the resonance coupler. Furthermore, it becomes easier to produce the resonance coupler. In a case where the substrates are made of a dielectric, it is possible to achieve a further improvement in transmission efficiency.

According to an aspect of the present disclosure, a transmission apparatus includes, for example, the resonance coupler according to one of the aspects described above, a transmission circuit that generates a high-frequency signal by modulating a high frequency wave according to an input signal and transmits the high-frequency signal as the transmission signal to the first resonator, and a reception circuit that receives the transmission signal from the second resonator and the third resonator and generates an output signal by rectifying the transmission signal.

By configuring the transmission apparatus in the above-described manner, it is possible to reduce a delay between the transmission signal from the second resonator and the transmission signal from the third resonator.

According to an aspect of the present disclosure, a switching system may include, for example, the transmission apparatus described above and a semiconductor switch that is controlled by the output signal.

The switching system according to the aspect of the disclosure, for example, may further include an integrated transmission circuit in which at least three transmission circuits including the transmission circuit are integrated, an integrated isolation device in which at least nine resonance couplers including the resonance coupler are integrated, and an integrated power device in which at least nine reception circuits including the reception circuit and at least nine bidirectional switches corresponding to the at least nine reception circuits are integrated, wherein the semiconductor switch may be one of the at least nine bidirectional switches, and the switching system may be a matrix converter in which the at least nine bidirectional switches are driven according to at least nine input signals applied to the integrated transmission circuit.

In the switching system according to the aspect of the disclosure, for example, each of the at least three transmission circuits may generate three high-frequency signals according to three input signals including the input signal, each of the at least nine resonance couplers may split one of the three high-frequency signals input from the integrated transmission circuit into two high-frequency signals, and may output the two high-frequency signals, and each of the at least nine reception circuits may receive the two high-frequency signals from the integrated isolation device, generate an output signal according to the two high-frequency signals, and output the output signal to corresponding one of the bidirectional switches.

By configuring the switching system in the above-described manner, it is possible to generate, from 3 input signals, 18 output signals having different reference voltages. Furthermore, providing each circuit in the integrated manner leads to a reduction in insulated gate wirings, which makes it possible to simplify the system.

According to an aspect of the present disclosure, a directional coupler, for example, includes: a first resonator that generates a reflection signal according to an input signal input; a second resonator to which the transmission signal is isolatedly transmitted from the first resonator, the second resonator spaced from and opposed to a first side of the first resonator, and electromagnetically coupled with the first resonator; and a third resonator to which the transmission signal is isolatedly transmitted from the first resonator, the third resonator spaced from and opposed to a second side, opposite to the first side, of the first resonator, and electromagnetically coupled with the first resonator.

In the directional coupler according to the aspect of the disclosure, for example, the distance between the first resonator and the second resonator may be greater than the distance between the first resonator and the third resonator.

By configuring the directional coupler in the above-described manner, for example, it is possible to more efficiently extract a signal corresponding to power only in one direction.

Next, embodiments are described below with reference to drawings.

The embodiments described below represent comprehensive or specific examples. Note that values, shapes, waveforms, materials, constituent elements, locations of and connections among the constituent elements, steps, orders of steps, and the like associated with the disclosure are described by way of example only but not limitation. Of constituent elements of the embodiments described above, constituent elements that are not described in a highest-level concept of the present disclosure are arbitrary constituent elements.

Note that terms representing directions such as "above", "below", "left", "right", and the like are used merely for purpose of providing a clear understanding, and thus these terms should not be restrictively construed. Note that in figures throughout the present description, like parts are denoted by like reference symbols or numerals, and a duplicated explanation will be omitted depending on the context.

Underlying Knowledge Forming Basis of the Present Disclosure

A viewpoint of the present inventors that has led to the achievement of the present disclosure is described below.

Figure 19:
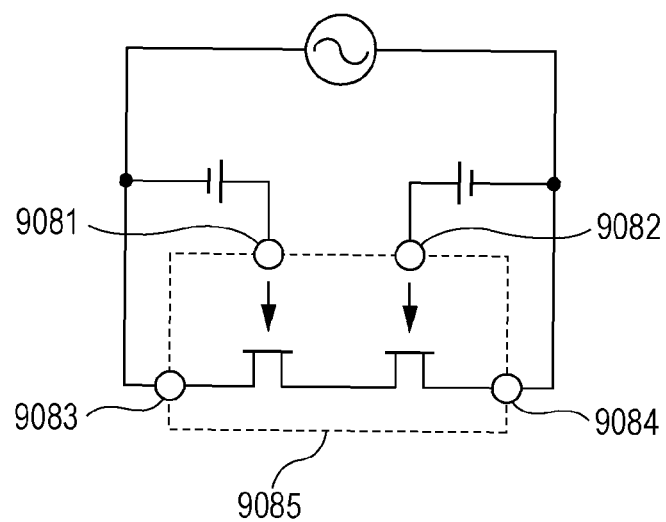
FIG. 19 is a circuit diagram illustrating a bidirectional switch and a gate driving circuit.

As illustrated in FIG. 19, a bidirectional switch 9085 includes a first gate 9081, a second gate 9082, a first source 9083, and a second source 9084. To control turning-on/off of the bidirectional switch, for example, a positive gate voltage is applied to each source terminal. In a circuit in which the bidirectional switch is disposed, a voltage at each source may vary. To handle such a situation, the sources are DC-isolated from other electric potentials such that they are in a floating state. That is, in a gate driving circuit that outputs an output signal, or driving signal, to the semiconductor switching device, a secondary side of the gate driving circuit is DC-isolated from its primary side to which an input signal is applied.

For example, a matrix converter uses a plurality of bidirectional switches. Each of the bidirectional switch is driven by two gate voltages having different reference voltages. With the conventional matrix converter, it is necessary to provide a large number of gate control signals and insulated gate wirings, which leads to a problem that the system becomes complicated and large in size.

In view of the above, the present inventors have investigated a technique to generate a plurality of signals having different reference voltages from one signal thereby making it to possible to perform isolated transmission, and have achieved a technique disclosed here. The disclosed technique makes it possible to simplify the system.

Embodiments

Examples of structures according to embodiments are described below.

Figure 2:
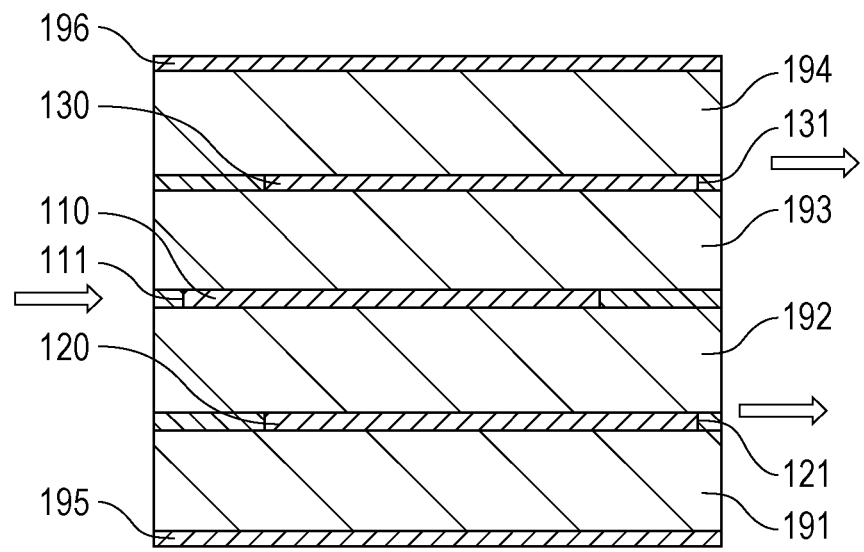
FIG. 2 is a schematic cross-sectional view taken along line II-II of FIG. 1.

FIG. 1 is a perspective view illustrating a structure of a resonance coupler 100 according to an embodiment of the present disclosure. FIG. 2 is a cross-sectional view taken along line II-II of FIG. 1.

The resonance coupler 100 transmits a high-frequency signal using an electromagnetic resonance coupling phenomenon. Here, the high-frequency signal denotes a signal with a frequency in a range from about 1 MHz to about 100 GHz. For example, the resonance coupler 100 transmits a high-frequency signal in a 5.8 GHz band.

The resonance coupler 100 includes a first input terminal 111 to which a high-frequency signal is input and a second output terminal 121 and a third output terminal 131 from which to output high-frequency signals. The resonance coupler 100 also includes a first dielectric 191, a second dielectric 192, a third dielectric 193, a fourth dielectric 194, a first resonator 110, a second resonator 120, a third resonator 130, a back-surface ground 195, and an upper-surface ground 196.

The back-surface ground 195 is disposed below the first dielectric 191. The upper-surface ground 196 is disposed above the fourth dielectric 194.

The second resonator 120 is disposed above the first dielectric 191. The second dielectric 192 is disposed above the second resonator 120. The first resonator 110 is disposed above the second dielectric 192. The third dielectric 193 is disposed above the first resonator 110. The third resonator 130 is disposed above the third dielectric 193. The fourth dielectric 194 is disposed above the third resonator 130.

The back-surface ground 195, the upper-surface ground 196, the first resonator 110, the second resonator 120, and the third resonator 130 each may be a metal wiring or pattern. For example, they may be formed using gold with a thickness of about 16 µm. The first dielectric 191, the second dielectric 192, the third dielectric 193, and the fourth dielectric 194 each may be a printed circuit board material with a relative permittivity of, for example, 10. For example, they may be printed circuit board materials with a thickness of about 0.28 mm.

Figure 3:
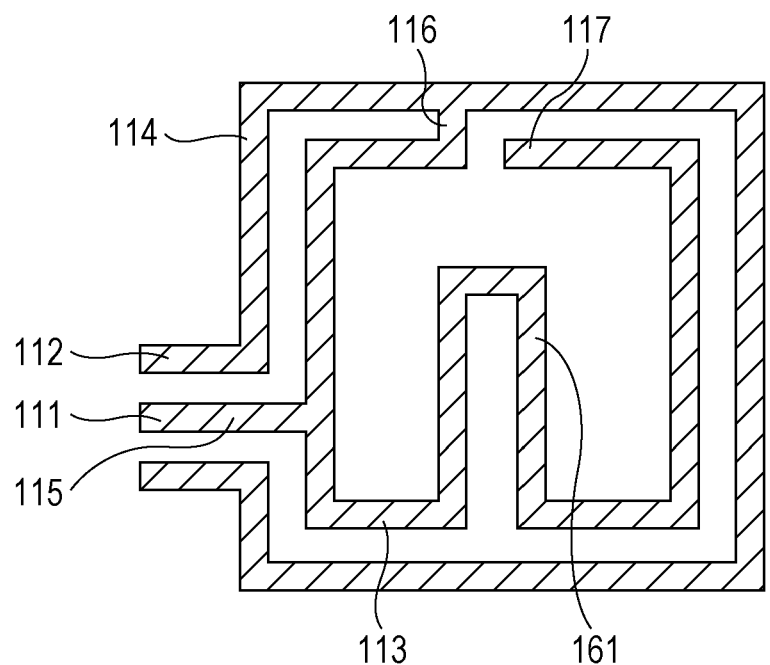
FIG. 3 is an top view of a first resonator in the resonance coupler illustrated in FIG. 1.
Figure 4:
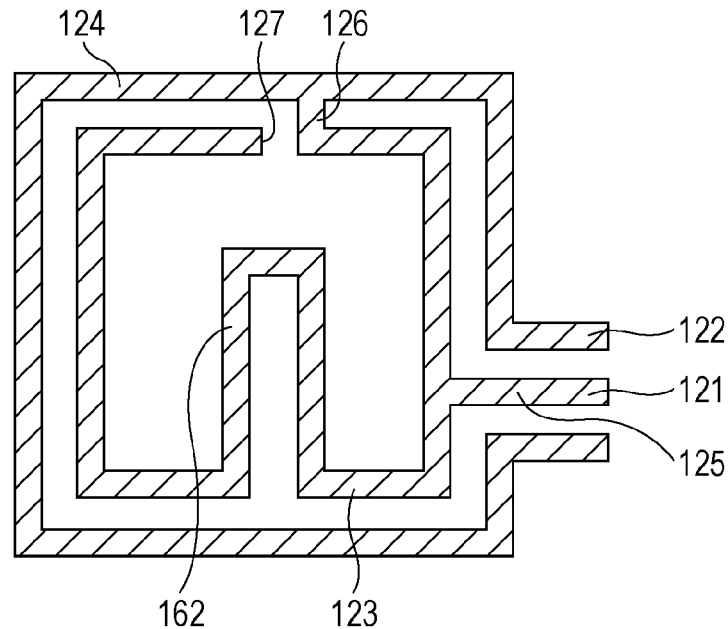
FIG. 4 is an top view of a second resonator in the resonance coupler illustrated in FIG. 1.
Figure 5:
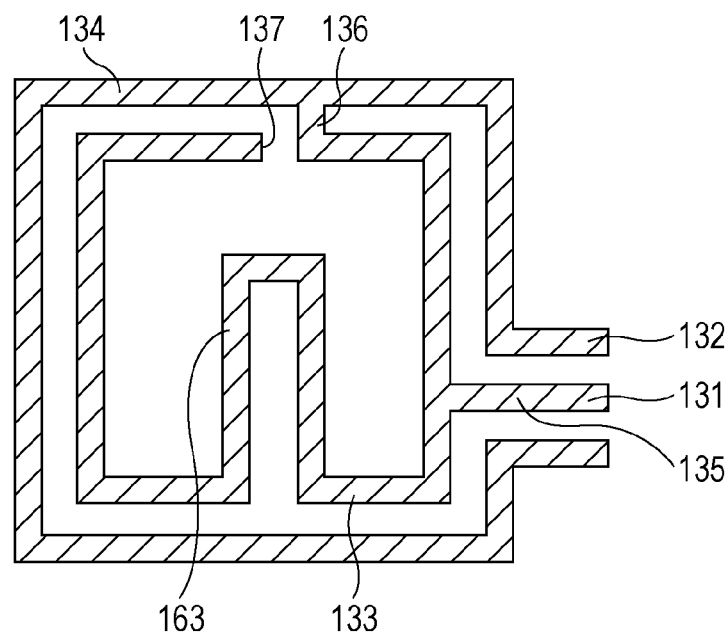
FIG. 5 is an top view of a third resonator in the resonance coupler illustrated in FIG. 1.

FIG. 3 is a top view of the first resonator 110 illustrated in FIG. 1. FIG. 4 is a top view of the second resonator 120 illustrated in FIG. 1. FIG. 5 is a top view of the third resonator 130 illustrated in FIG. 1.

A plane shape of the first resonator 110 is described.

The first resonator 110 includes a first reference terminal 112 and a first input terminal 111. The first resonator 110 also includes a first inner loop wiring 113, a first outer loop wiring 114, a first short-circuit wiring 116, and a first input wiring 115. The first outer loop wiring 114 is disposed in an area outside the first inner loop wiring 113.

One end of the first input wiring 115 is a first input terminal 111. The other end of the first input wiring 115 is connected to the first inner loop wiring 113. The first inner loop wiring 113 is a wiring in a loop shape that is not completely closed. One end of the first inner loop wiring 113 is a first open end 117. The other end of the first inner loop wiring 113 is connected to the first outer loop wiring 114 via a first short-circuit wiring 116. The first inner loop wiring 113 includes a folded part 161 located between the first open end 117 and a connection point where the first inner loop wiring 113 is connected to the first input wiring 115. The first inner loop wiring 113 occupies a rectangular-shaped area including the folded part 161.

The first outer loop wiring 114 is a wiring in a loop shape that is not completely closed. The first outer loop wiring 114 has a rectangular shape. One end of the first outer loop wiring 114 is electrically connected to the first reference terminal 112. As illustrated in FIG. 1 and FIG. 3, the other end of the first outer loop wiring 114 is also electrically connected to the first reference terminal 112. The distance between the first inner loop wiring 113 and the first outer loop wiring 114 is, for example, 0.15 mm. In FIG. 3, the horizontal length of the rectangular-shaped area occupied by the first inner loop wiring 113 is, for example, 1.2 mm, and the vertical length is, for example, 1.1 mm. In FIG. 3, the horizontal length of the rectangular-shaped area occupied by the first outer loop wiring 114 is, for example, 1.7 mm, and the vertical length is, for example, 1.6 mm.

In the present disclosure, the loop shape refers to a shape represented by one continuous line which does not cross itself. The loop shape may be, for example, a ring shape or a circular shape. The term "loop shape that is not completely closed" includes a shape in which a part of a loop-shaped wiring is cut out such that two ends defining the cut-out part are located not far away from each other. A specific distance between the two wiring ends located not far away is, for example, 10 or less times the wiring width. The folded part is a part folded into the inside area of the loop shape wiring. The loop-shaped wiring having the cut-out part does not necessarily to have an actually cut-out part as long as the loop-shaped wiring has an open part.

The distance between the first inner loop wiring 113 and the first outer loop wiring 114 may be in a range from 0.001 mm to 1.0 mm. The first inner loop wiring 113, the first outer loop wiring 114, the first short-circuit wiring 116, and the first input wiring 115 each may have a width in a range from 0.001 mm to 1.0 mm. For example, the width thereof may be 0.1 mm. Note that the width does not necessarily need to be equal for these wiring.

A plane shape of the second resonator 120 is described below.

The second resonator 120 includes a second reference terminal 122 and a second output terminal 121. The second resonator 120 also includes a second inner loop wiring 123, a second outer loop wiring 124, a second short-circuit wiring 126, and a second output wiring 125. The second outer loop wiring 124 is disposed in an area outside the second inner loop wiring 123.

One end of the second output wiring 125 is a second output terminal 121. The other end of the second output wiring 125 is connected to the second inner loop wiring 123. The second inner loop wiring 123 is a wiring in a loop shape that is not completely closed. One end of the second inner loop wiring 123 is a second open end 127. The other end of the second inner loop wiring 123 is connected to the second outer loop wiring 124 via a second short-circuit wiring 126. The second inner loop wiring 123 includes a folded part 162 located between the second open end 127 and a connection point where the second inner loop wiring 123 is connected to the second output wiring 125. The second inner loop wiring 123 occupies a rectangular-shaped area including the folded part 162.

The second outer loop wiring 124 is a wiring in a loop shape that is not completely closed. The second outer loop wiring 124 has a rectangular shape. One end of the second outer loop wiring 124 is electrically connected to the second reference terminal 122. As illustrated in FIG. 1 and FIG. 4, the other end of the second outer loop wiring 124 is also electrically connected to the second reference terminal 122. The distance between the second inner loop wiring 123 and the second outer loop wiring 124 is, for example, 0.15 mm. In FIG. 4, the horizontal length of the rectangular-shaped area occupied by the second inner loop wiring 123 is for example, 1.2 mm, and the vertical length is, for example, 1.1 mm. In FIG. 4, the horizontal length of the rectangular-shaped area occupied by the second outer loop wiring 124 is, for example, 1.7 mm, and the vertical length is, for example, 1.6 mm. That is, the plane shape of the second resonator 120 is equal to a shape obtained by horizontally flipping the plane shape of the first resonator 110.

A plane shape of the third resonator 130 is described below.

The third resonator 130 includes a third reference terminal 132 and a third output terminal 131. The third resonator 130 also includes a third inner loop wiring 133, a third outer loop wiring 134, a third short-circuit wiring 136, and a third output wiring 135. The third outer loop wiring 134 is disposed in an area outside the third inner loop wiring 133.

One end of the third output wiring 135 is a third output terminal 131. The other end of the third output wiring 135 is connected to the third inner loop wiring 133. The third inner loop wiring 133 is a wiring in a loop shape that is not completely closed. One end of the third inner loop wiring 133 is a third open end 137. The other end of the third inner loop wiring 133 is connected to the third outer loop wiring 134 via a third short-circuit wiring 136. The third inner loop wiring 133 has a folded part 163 located between the third open end 137 and a connection point where the third inner loop wiring 133 is connected to the third output wiring 135. The third inner loop wiring 133 occupies a rectangular-shaped area including the folded part 163.

The third outer loop wiring 134 is a wiring in a loop shape that is not completely closed. The third outer loop wiring 134 has a rectangular shape. One end of the third outer loop wiring 134 is electrically connected to the third reference terminal 132. As illustrated in FIG. 1 and FIG. 5, the other end of the third outer loop wiring 134 is electrically connected to the third reference terminal 132. The distance between the third inner loop wiring 133 and the third outer loop wiring 134 is, for example, 0.15 mm. In FIG. 5, the horizontal length of the rectangular-shaped area occupied by the third inner loop wiring 133 is for example, 1.2 mm, and the vertical length is, for example, 1.1 mm. In FIG. 5, the horizontal length of the rectangular-shaped area occupied by the third outer loop wiring 134 is for example, 1.7 mm, and the vertical length is, for example, 1.6 mm. That is, the plane shape of the third resonator 130 is equal to a shape obtained by horizontally flipping the plane shape of the first resonator 110.

In the resonance coupler 100 illustrated in FIG. 1, the first resonator 110, the second resonator 120, and the third resonator 130 are disposed such that the center of the first inner loop wiring 113, the center of the second inner loop wiring 123, and the center of the third inner loop wiring 133 are coincident.

In the resonance coupler according to the present embodiment, because an electromagnetic resonance coupling phenomenon is used, a variation in position has only a very small influence on the characteristic. Therefore, the centers of the inner loop wirings do not necessarily need to be coincident. It is sufficient if the first inner loop wiring 113 of the first resonator 110, the second inner loop wiring 123 of the second resonator 120, and the third inner loop wiring 133 of the third resonator 130 are overlapped.

In the examples illustrated in FIGS. 1 to 5, the plane shape of each of the second resonator 120 and the third resonator 130 is equal to a plane shape obtained by horizontally flipping the plane shape of the first resonator 110. However, the plane shape of each resonator does not necessarily need to satisfy this relationship. The first resonator 110, the second resonator 120, and the third resonator 130 may be different in shape within a production tolerance, within an assembly tolerance, within a design tolerance, within a characteristic adjustment tolerance, and the like. For example, the first resonator 110, the second resonator 120, and the third resonator 130 may be different in shape within a range of about 10 times the wiring width. In particular, the first outer loop wiring 114, the second outer loop wiring 124, and the third outer loop wiring 134 do not exert a significant influence on the electromagnetic resonance coupling. Therefore, a large difference may be allowed in wiring width, size, and shape among the first resonator 110, the second resonator 120, and the third resonator 130. For example, it may be allowed to reduce the distance between the first outer loop wiring 114 and the first inner loop wiring 113. This makes it possible to adjust the operating frequency.

It may be allowed to reduce the size by short-circuiting one end of first resonator 110. In this case, the first outer loop wiring 114 may be disposed to achieve a short circuit at a via hole.

The first inner loop wiring 113, the second inner loop wiring 123, and the third inner loop wiring 133 may not include the folded parts 161, 162, and 163.

The two ends of the first outer loop wiring 114 may be connected to each other, for example, through via holes as illustrated in FIG. 1 so as to function as the first reference terminal 112. The two ends of the second outer loop wiring 124 and the two ends of the third outer loop wiring 134 may be connected in a similar manner.

The back-surface ground 195, the upper-surface ground 196, the first resonator 110, the second resonator 120, and the third resonator 130 may be formed of a conductive material with a film thickness in a range from 0.01 to 100 μm. For example, aluminum may be used as the conductive material. The first dielectric 191, the second dielectric 192, the third dielectric 193, and the fourth dielectric 194 may be a substrate or a layer of semiconductor such as silicon or an organic material. The thickness of these dielectrics may be in a range from 0.001 mm to 10.0 mm or in a range less than about 4 times the wavelength of the operating frequency.

A space may exist between adjacent two of the first dielectric 191, the second dielectric 192, the third dielectric 193, and the fourth dielectric 194. A space may be formed instead of one or more of the dielectrics. In other words, one or all of dielectrics may be an air layer.

For example, a wiring layer may be disposed within the first dielectric 191 that is located between the back-surface ground 195 and the second resonator 120. A wiring layer may be disposed within the second dielectric 192 that is located between the second resonator 120 and the first resonator 110. A wiring layer may be disposed within the third dielectric 193 that is located between the first resonator 110 and the third resonator 130. A wiring layer may be disposed within the fourth dielectric 194 that is located between the third resonator 130 and the upper-surface ground 196.

One of or all of the first dielectric 191, the second dielectric 192, the third dielectric 193, and the fourth dielectric 194 may be a multilayer dielectric. The first dielectric 191 or the second dielectric 192 may be removed. The upper-surface ground 196 or the back-surface ground 195 may be removed.

Operation

An operational example of the resonance coupler 100 is described below with reference to FIGS. 1 to 5.

The resonance coupler 100 illustrated in FIG. 1 transmits a high-frequency signal with a low loss using the electromagnetic resonance coupling phenomenon. The high-frequency signal has a frequency of, for example, about 5.8 GHz. In the resonance coupler 100, the high-frequency signal input from the first input terminal 111 is output from the second output terminal 121 and the third output terminal 131. For the high-frequency signal input from the first input terminal 111, the first reference terminal 112 provides a ground level. For the high-frequency signal output from the second output terminal 121, the second reference terminal 122 provides a ground level. For the high-frequency signal output from the third output terminal 131, the third reference terminal 132 provides a ground level.

The ground of the circuit on the primary side is connected to the first reference terminal 112. The first ground of the circuit on the secondary side is connected to the second reference terminal 122. The second ground on the secondary side is connected to the third reference terminal 132. The first ground is different from the second ground. The resonance coupler 100 is capable of transmitting only the high frequency signal, and is capable of DC-isolating the circuit on the primary side and the circuit on the secondary side from each other. Furthermore, in the circuit on the secondary side, a circuit connected to the second output terminal 121 and the second reference terminal 122 is capable of being DC-isolated from a circuit connected to the third output terminal 131 and the third reference terminal 132.

The total length of the first inner loop wiring 113 of the first resonator 110 corresponds to a wiring length from the first open end 117 to the first short-circuit wiring 116. The total length of the first inner loop wiring 113 is set to be equal to about one quarter of an equivalent wavelength of an operating frequency of the resonance coupler 100. Similarly, the total length of the second inner loop wiring 123 and the total length of the third inner loop wiring 133 are also set to be equal to about one quarter of the equivalent wavelength of the operating frequency of the resonance coupler 100. The operating frequency of the resonance coupler 100 is, for example, 5.8 GHz. One end of the first inner loop wiring 113 is short-circuited to the first reference end and the other end is open-circuited. Thus, the high frequency signal input from the first input terminal 111 to the first inner loop wiring 113 forms a standing wave in the first inner loop wiring 113, which causes resonance to occur therein.

The second resonator 120 and the third resonator 130 are disposed such that the first resonator 110 is located between them and such that the second resonator 120 and the third resonator 130 are located close to an area of the first resonator 110. The first resonator 110 and the second resonator 120 are electromagnetically coupled, and the first resonator 110 and the third resonator 130 are electromagnetically coupled. Therefore, when the high frequency signal input to the first resonator 110 has resonance in the first inner loop wiring 113, high frequency signal is excited in the second inner loop wiring 123 and the third inner loop wiring 133 that are electromagnetically coupled with the first inner loop wiring 113, and resonance starts therein. As a result, the high frequency signal in the first resonator 110 is transmitted to the second resonator 120 and the third resonator 130.

The first inner loop wiring 113 is connected to the first input terminal 111 via the first input wiring 115. The second inner loop wiring 123 is connected to the second output terminal 121 via the second output wiring 125. The third inner loop wiring 133 is connected to the third output terminal 131 via the third output wiring 135. In this structure, the high-frequency signal input from the first input terminal 111 is output from the second output terminal 121 and the third output terminal 131. When the distance between the first resonator 110 and the second resonator 120 is equal to the distance between the first resonator 110 and the third resonator 130, the output from the second output terminal 121 is equal to the output from the third output terminal 131. In this case, the electric power of the high-frequency signal input from the first input terminal 111 is equally split into two signals which are output respectively from the second output terminal 121 and the third output terminal 131.

The state in which a high frequency signal has resonance in the first inner loop wiring 113 is, for example, a state in which a current is zero and a voltage has a maximum value in the first short-circuit wiring 116 and the current has a maximum value and the voltage is zero at the first open end 117. The ratio of the voltage to the current, that is, the impedance, varies depending on a point along the first inner loop wiring 113. Therefore, the first inner loop wiring 113 and the first input wiring 115 are connected to each other at a point at which the impedance of the first inner loop wiring 113 is equal to the impedance of the first input wiring 115 thereby allowing it to reduce reflection and thus to efficiently input the high-frequency signal to the first inner loop wiring 113.

Figure 6:
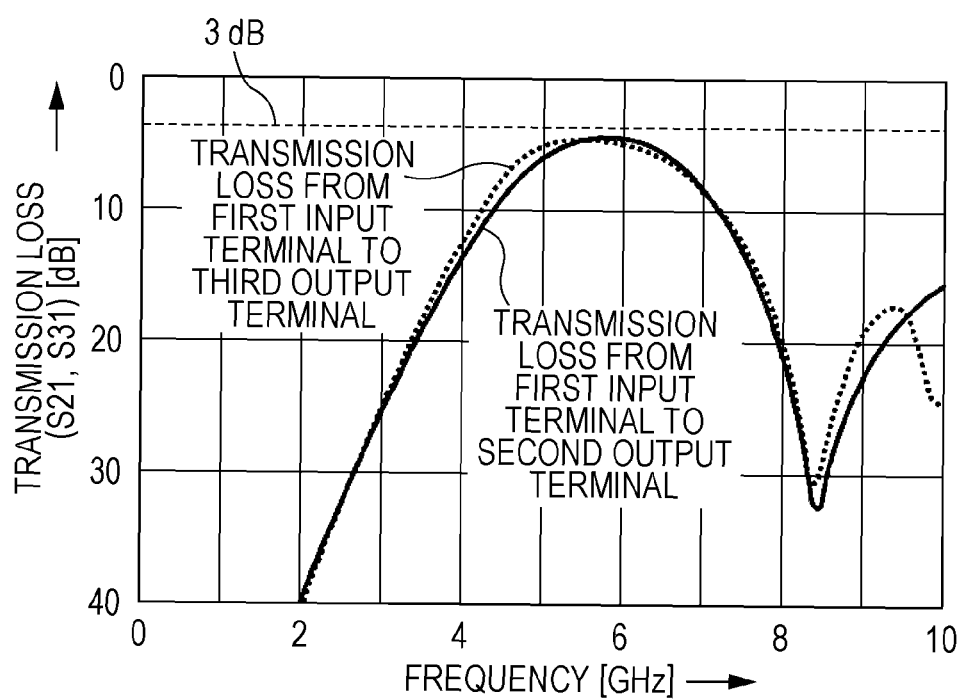
FIG. 6 is a diagram illustrating an example of a transmission characteristic of a resonance coupler according to an embodiment.

FIG. 6 illustrates a transmission characteristic as a function of a frequency for the resonance coupler 100 according to the embodiment illustrated in FIG. 1. A solid curve represents a conduction loss from the first input terminal 111 to the second output terminal 121, and a dotted curve represents a transmission loss from the first input terminal 111 to the third output terminal 131.

The transmission loss illustrated in FIG. 6 indicates a power loss of the high frequency signal output from the second output terminal 121 or the third output terminal 131 with respect to power of the high frequency signal input to the first input terminal 111. For example, when the output power of the high frequency signal is one half of the input power, a loss is 3 dB. That is, in a case where one high frequency signal is ideally split into two signals with no loss, a transmission loss is 3 dB. In the example illustrated in FIG. 6, the resonance coupler 100 according to the embodiment is capable of transmitting a high frequency signal with a loss of 4 dB for a frequency range ±2 GHz centered at 5.8 GHz, that is, for a range from 4.8 GHz to 6.8 GHz. That is, in the present embodiment, as low a loss as 4 dB can be achieved.

Furthermore, as illustrated in FIG. 6, the loss in transmission from the first input terminal 111 to the second output terminal 121 is substantially equal to the loss in transmission from the first input terminal 111 to the third output terminal 131. This indicates that the power of the high frequency signal input from the first input terminal 111 is equally split into two signals. Thus, the result represented in FIG. 6 indicates that the resonance coupler 100 according to the present embodiment functions as a high-frequency power splitter.

In the present embodiment, there is no contact among the first resonator 110, the second resonator 120, and the third resonator 130, and thus DC-isolation is achieved among them. In other words, the primary side and the secondary side of the resonance coupler 100 are isolated from each other, and, on the secondary side, the second resonator 120 and the third resonator 130 are isolated from each other. Therefore, On the secondary side, a circuit connected with the second output terminal 121 and the second reference terminal 122 is isolated from a circuit connected with the third output terminal 131 and the third reference terminal 132. The resonance coupler 100 constructed in the above-described manner is suitable, for example, for driving an insulated gate of a bidirectional switch or driving insulated gates of two semiconductor switching devices.

When the dielectric thickness in the resonance coupler 100 according to the present embodiment is set to 0.28 mm, it is possible to achieve a withstand voltage of 5.0 kV. That is, the resonance coupler 100 is capable of having a high withstand voltage characteristic.

Features of Electromagnetic Resonator

The resonance coupler 100 according to the embodiment uses, by way of example, the electromagnetic resonance coupling. This type of electromagnetic resonance coupler has following features.

The size of the resonator is determined by the operating frequency. The higher the operating frequency, the smaller the design size of the resonance coupler 100 is allowed to achieve.

The resonance coupler 100 is capable of transmitting a signal with a low loss using the resonance coupling phenomenon even when the resonators are spaced apart away. Therefore, by increasing the space between the resonators, it is possible to increase the withstand voltage.

Use of the resonance coupling phenomenon allows the resonance coupler 100 to have high resistance to external noise.

The electromagnetic resonance coupling is weak coupling, which means that the transmission characteristic of the resonance coupler 100 is not significantly influenced by a position deviation between the resonators and/or a difference in shape between the resonators. Therefore, the resonance coupler 100 does not need high accuracy in a production or assembly process.

Furthermore, because the electromagnetic resonance coupling is weak coupling, it is possible to achieve high resistance against ground noise and it is possible to achieve a high common-mode rejection ratio.

By constructing the resonance coupler 100 so as to have a multilayer structure, it is possible to design the resonance coupler 100 so as to have a small occupied area.

The resonance coupler 100 has a wide transmission band, which makes it possible to transmit a high-speed modulation signal.

There is no delay between the signal output from the second output terminal 121 and the signal output from the third output terminal 131. Therefore, the resonance coupler 100 is allowed to be used to control devices or circuits in which precise timing between two signals is required. For example, the resonance coupler 100 is capable of driving two transistors in a half-bridge circuit without dead time.

The resonance coupler 100 that splits a signal by non-contact transmission is capable of providing an extremely high signal isolation compared with that achieved by branch wirings or the like.

The resonance coupler 100 is capable of generating, from one signal, two isolated signals having different references. This makes it possible to simplify a transmission circuit.

In the structure in which the resonance coupler 100 includes the first outer loop wiring 114, the second outer loop wiring 124, and the third outer loop wiring 134, the resonance coupler 100 is highly resistant to external noise and is low in external irradiation.

The resonance coupler 100 has low capacitive or inductive components, and thus no time delay occurs when power is split.

By adjusting the distance between the first resonator 110 and the second resonator 120 and/or the distance between the first resonator 110 and the third resonator 130, it is possible to set the output signal distribution ratio to an arbitrary value. The output signal distribution ratio refers to the ratio of the signal output from the third output terminal 131 to the signal output from the second output terminal 121. Alternatively, by adjusting the shape of the second inner loop wiring 123 and/or the shape of the third inner loop wiring 133, it is possible to set the output signal distribution ratio to an arbitrary value.

By adjusting the distance between the resonators and the shapes of the inner loop wirings, it is possible to configure the resonance coupler 100 to function as a frequency filter. For example, it is possible to design the resonance coupler 100 such that a signal with 5.0 GHz is output from the second output terminal 121 and a signal with 6.0 GHz is output from the third output terminal 131. Also in this case, the resonance coupler 100 is capable of having no impedance mismatching or the like, and is capable of transmitting a signal with a low loss.

Examples of Usage

An example of a manner in which the resonance coupler according to the embodiment is used is described below with reference to FIG. 7.

Figure 7:
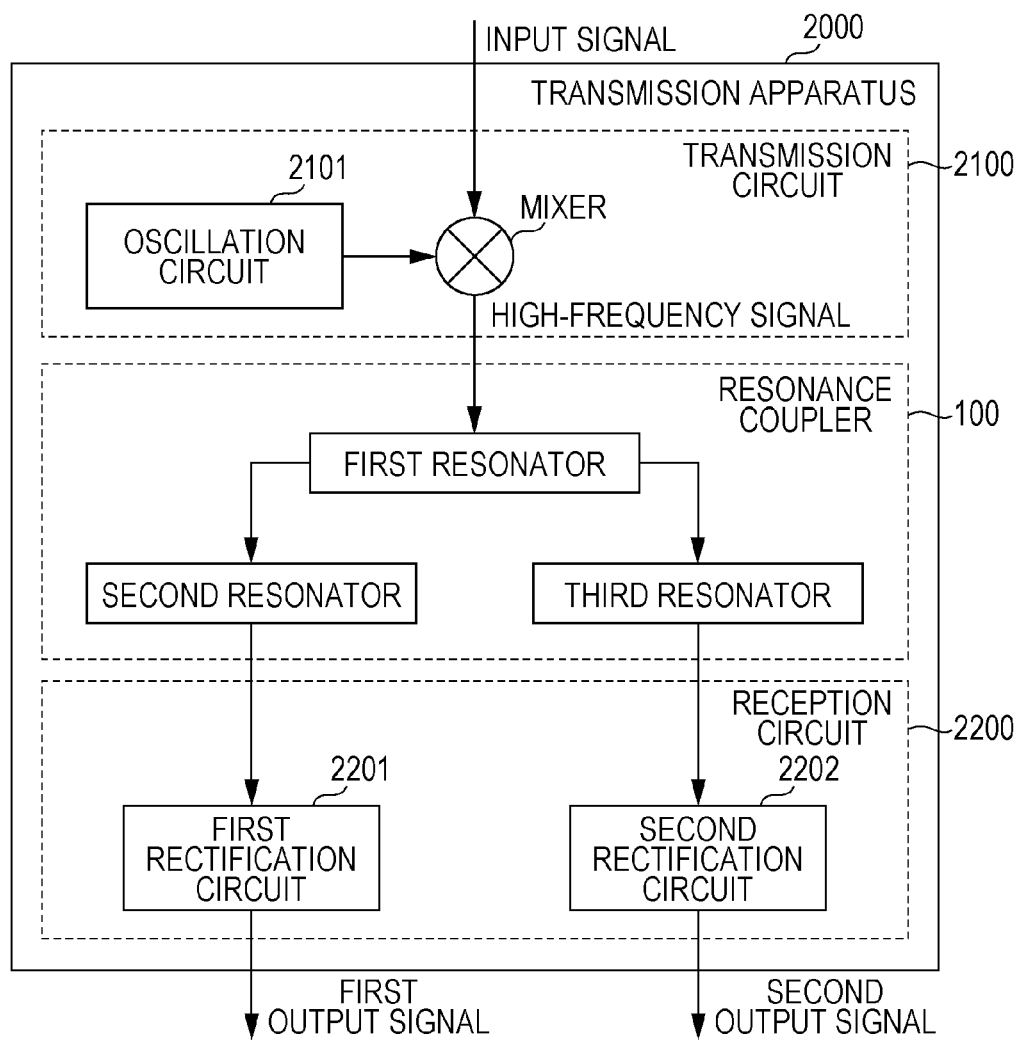
FIG. 7 is a block diagram illustrating an example of a configuration of a transmission apparatus including a resonance coupler.

FIG. 7 is a block diagram illustrating an example of a transmission apparatus including the resonance coupler according to the present embodiment.

The transmission apparatus 2000 according to the present embodiment includes a resonance coupler 100, a transmission circuit 2100, and a reception circuit 2200. The transmission circuit 2100 generates a high-frequency signal by modulating a high frequency wave according to an input signal and transmits the resultant high-frequency signal to the first resonator. That is, the high-frequency signal is a modulated signal obtained by modulating a high-frequency carrier wave. The high-frequency signal is a transmission signal transmitted by the resonance coupler 100. The reception circuit 2200 rectifies the high-frequency signal received from the second resonator thereby generating a first output signal, and rectifies the high-frequency signal received from the third resonator thereby generating a second output signal.

The transmission circuit 2100 may include an oscillation circuit 2101 that generates a high-frequency wave with high frequency oscillation. The transmission circuit 2100 may be configured in a different manner as long as it is possible to generate a modulated signal.

The reception circuit 2200 may include a first rectifier circuit 2201 that rectifies the high-frequency signal received from the second resonator. The reception circuit 2200 may include a second rectifier circuit 2202 that rectifies the high-frequency signal received from the third resonator.

Figure 8:
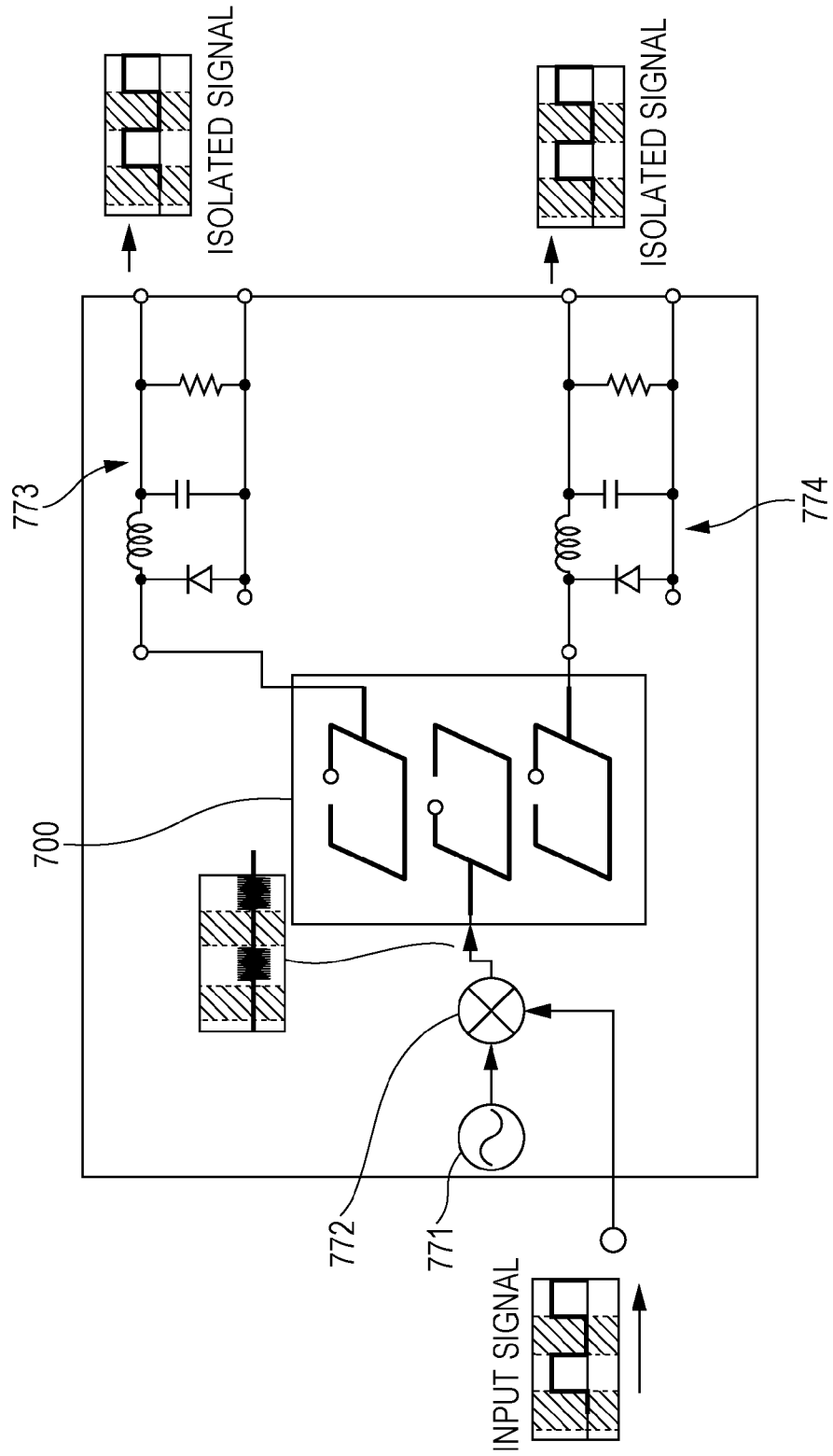
FIG. 8 is a diagram illustrating an example of a configuration of a gate driving circuit including a resonance coupler.

Next, an example of a manner in which the transmission apparatus 2000 according to the embodiment is used is described below with reference to FIG. 8. FIG. 8 is a diagram illustrating a gate driving circuit including a resonance coupler 700. The resonance coupler 700 may be, for example, the resonance coupler 100 according to the embodiment.

The gate driving circuit includes a high-frequency oscillator 771, a mixer 772, the resonance coupler 700, a first rectifier circuit 773, and a second rectifier circuit 774. In FIG. 8, a wiring structure of the resonance coupler 700 is represented in a simplified manner. The gate driving circuit illustrated in FIG. 8 is a circuit that generates two gate signals from one input signal. Each gate signal is an isolated signal that is isolated from the primary side of the gate driving circuit.

The high frequency wave generated by the high-frequency oscillator 771 is input to the mixer 772. The frequency of the high frequency wave is, for example, 5.8 GHz. An input signal that is input from the outside of the gate driving circuit is input to the mixer 772. The mixer 772 performs amplitude modulation on the high frequency wave according to a waveform of the input signal thereby generating a high-frequency signal. The high-frequency signal is output from the mixer 772 and is input to the resonance coupler 700. The resonance coupler 700 splits the high-frequency signal into two signals and transmits them from the primary side to the secondary side in the isolated manner. The two split high-frequency signals are respectively input to the first rectifier circuit 773 and the second rectifier circuit 774. The first rectifier circuit 773 and the second rectifier circuit 774 respectively rectify the input high-frequency signals thereby generating output signals. For example, each output signal has a waveform similar to that of the input signal. The output signals are output from the gate driving circuit.

As described above, the resonance coupler 700 generates two high-frequency signals from the one input high-frequency signal. The generated two high-frequency signals are isolated from each other. That is, the resonance coupler 700 outputs the two high-frequency signals in a floating state. As a result, the two output signals are generated from the one input signal. By using these two output signals to drive gates of a bidirectional switch, it is possible to control the bidirectional switch by only one gate driving circuit. In this case, because the delay between the two output signals is small, it is possible to reduce the difference in timing control between the two gates of the bidirectional switch. As a result, an improvement in the characteristic of the bidirectional switch is achieved. Furthermore, because the gate driving circuit uses the high frequency signal, it is possible to achieve a high-speed operation.

The transmission apparatus, for example, the gate driving circuit, according to the present embodiment and a semiconductor switch may be included in a switching system. In this case, the semiconductor switch may be controlled by the output signals from the transmission apparatus.

As an example of a switching system, a matrix converter is disclosed below.

Matrix Converter

Figure 9:
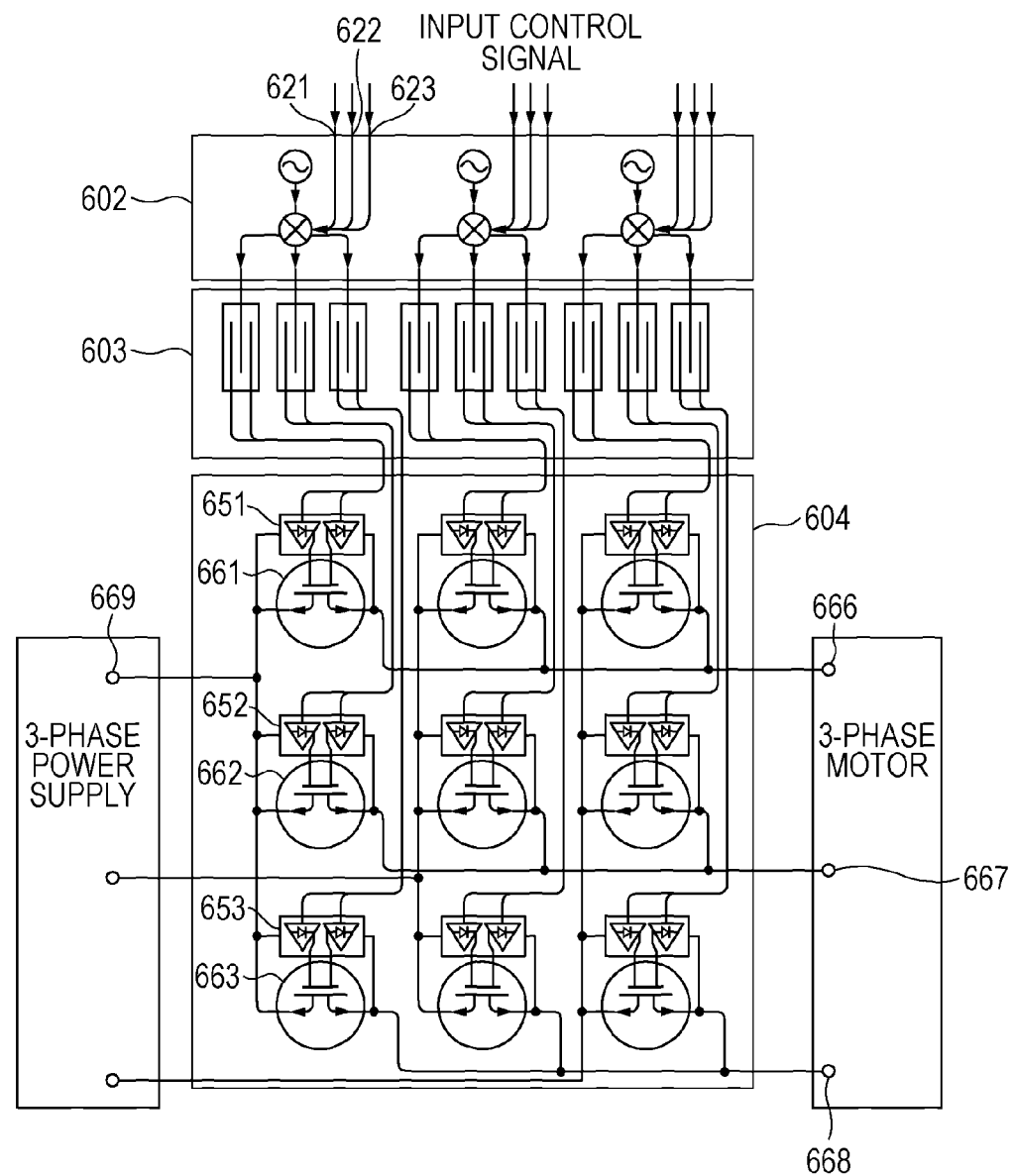
FIG. 9 is a diagram illustrating an example of a configuration of a 3-phase AC matrix converter system including a resonance coupler.

FIG. 9 illustrates an example of a 3-phase AC matrix converter system including the resonance coupler according to the embodiment.

The 3-phase AC matrix converter system illustrated in FIG. 9 includes an integrated transmission circuit 602, an integrated isolation device 603, and an integrated power device 604. The integrated transmission circuit 602 is a circuit that transmits high-frequency signals for driving gates. The integrated isolation device 603 is a device that performs isolated transmission of the high-frequency signals. The integrated isolation device 603 includes, for example, integrated resonance couplers according to the embodiment. In the integrated power device 604, reception circuits that rectify high-frequency signals and thereby generate gate signals and bidirectional switches driven by the gate signals are integrated. The 3-phase AC matrix converter receives power supplied from a 3-phase power supply via fourth terminals 669. Outputs from the 3-phase AC matrix converter are supplied to a first terminal 666 of a 3-phase motor, a second terminal 667, and a third terminal 668 of a 3-phase motor.

The integrated transmission circuit 602 is a circuit that outputs nine high-frequency signals. The integrated transmission circuit 602 includes, for example, three transmission circuits each similar to the transmission circuit illustrated in FIG. 7. Each transmission circuit may generate three high-frequency signals according to three input signals respectively applied to a first input terminal 621, a second input terminal 622, and a third input terminal 623. The integrated isolation device 603 includes, for example, nine electromagnetic resonance couplers. Each electromagnetic resonance coupler receives one input high-frequency signal and outputs two high-frequency signals. The integrated power device 604 includes nine units, and each unit includes a combination of a bidirectional switch and a reception circuit. That is, the integrated power device 604 includes a first bidirectional switch 661, a second bidirectional switch 662, a third bidirectional switch 663, a first reception circuit 651, a second reception circuit 652, and a third reception circuit 653. By employing the structured described above, it is possible to realize the matrix converter in a very small form.

Figure 10:
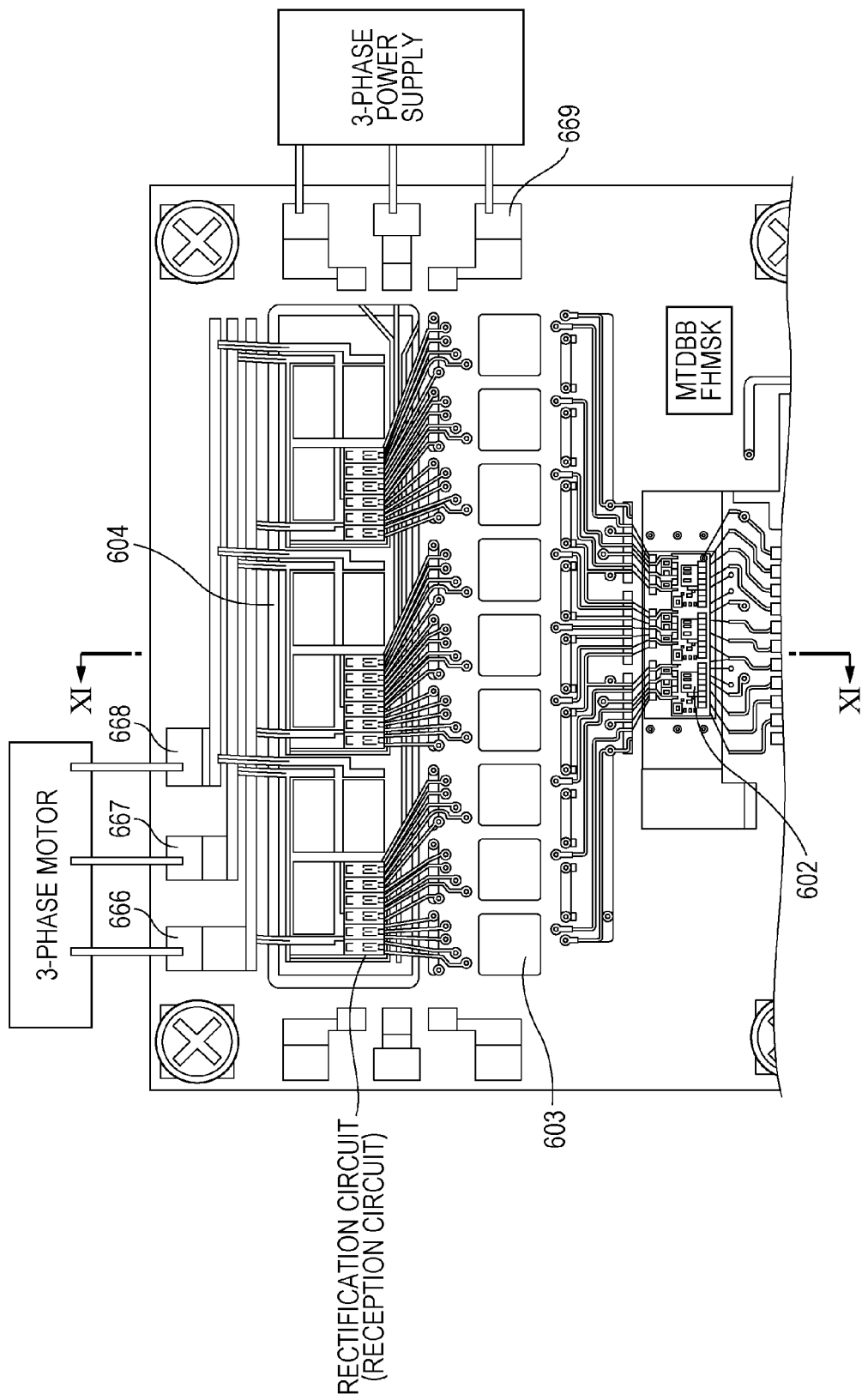
FIG. 10 is an top view illustrating a specific example of a 3-phase AC matrix converter system including a resonance coupler.
Figure 11:
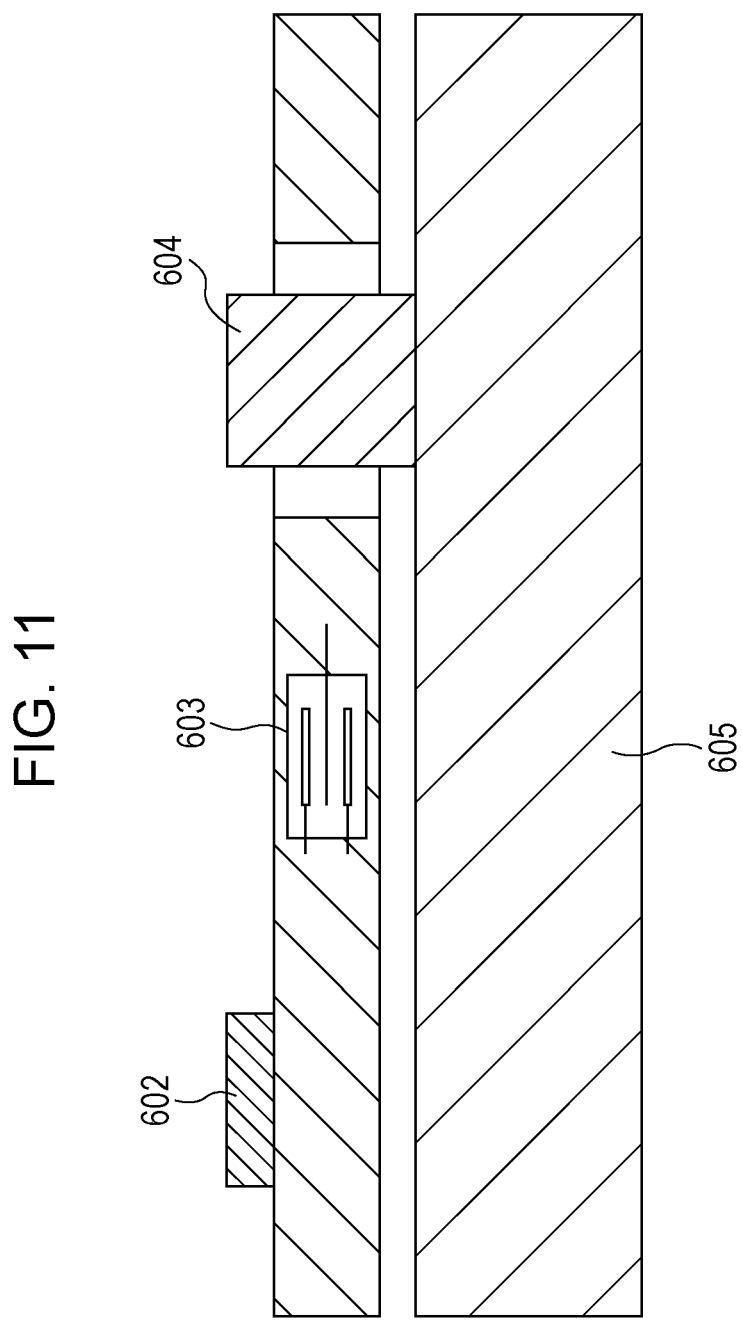
FIG. 11 is a cross-sectional view taken along a line XI-XI of FIG. 10.

FIG. 10 is an top view illustrating a specific example of the 3-phase AC matrix converter system illustrated in FIG. 9. FIG. 11 is a schematic cross-sectional view taken along line XI-XI of FIG. 10.

A printed circuit board is disposed on a heat sink 605. The integrated isolation device 603 is formed in the printed circuit board. The integrated transmission circuit 602 is mounted on the printed circuit board. A hole is formed in part of the printed circuit board such that the hole reaches the heat sink 605. In this hole, the integrated power device 604 is disposed such that the integrated power device 604 is in contact with the heat sink 605. The integrated isolation device 603 is located between the integrated power device 604 and the integrated transmission circuit 602. By disposing the integrated isolation device 603 in the above-described manner, it is possible to separate a high-frequency region from a low-frequency region, which makes it possible to realize the matrix converter system that operates in a stable manner.

The integrated transmission circuit 602 may be disposed above the integrated isolation device 603.

The switching system including the resonance coupler according to the embodiment is not limited to the example described above. For example, the switching system may be another type of matrix converter or a power conversion apparatus. The power conversion apparatus may be, for example, a 2-phase/3-phase conversion system, a single-phase/3-phase conversion system, or a 2-phase/2-phase conversion system.

Examples of Modifications of Resonance Coupler

Some examples of modifications of the resonance coupler 100 according to the embodiment are described below.

Figure 12:
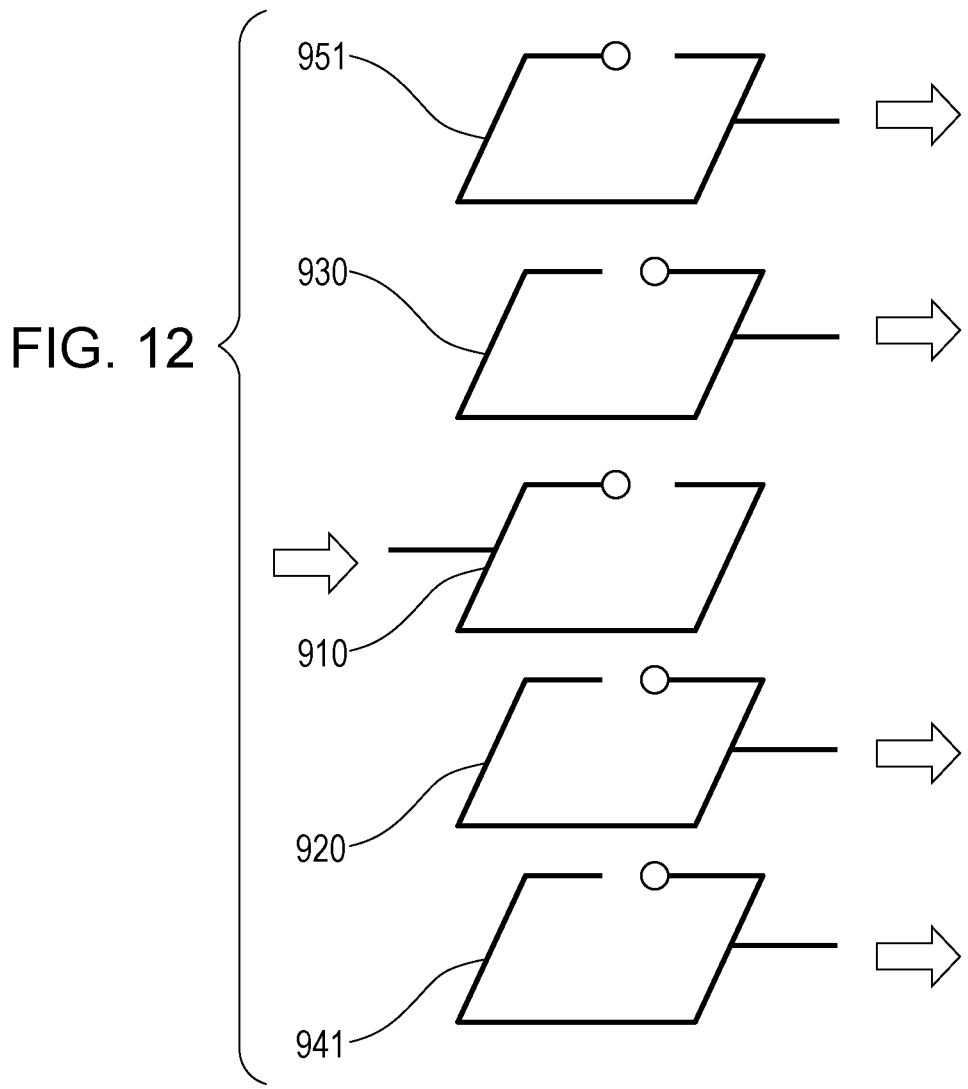
FIG. 12 is a schematic diagram illustrating a modified example of a resonance coupler.

FIG. 12 illustrates an example of a resonance coupler including a first resonator 910, a second resonator 920, a third resonator 930, a fourth resonator 941, and a fifth resonator 951. As can be seen from this example, the number of resonators included in the resonance coupler according to the embodiment is not limited to three. In the example illustrated in FIG. 12, the second resonator 920, the third resonator 930, the fourth resonator 941, and the fifth resonator 951 are respectively electromagnetically coupled to the first resonator 910. A signal input to the first resonator 910 is split into four signals, which are respectively output from the second resonator 920, the third resonator 930, the fourth resonator 941, and the fifth resonator 951. Instead of employing the structure illustrated in FIG. 12, for example, it may be allowed to a structure in which a plurality of resonators have an input terminal.

Figure 13:
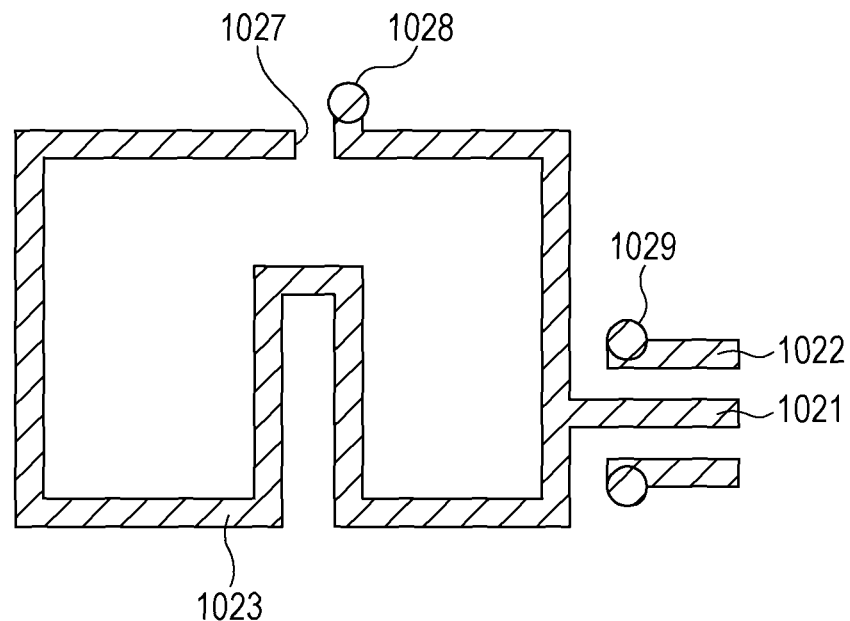
FIG. 13 is a top view illustrating a modified example of a second resonance coupler.

FIG. 13 illustrates an example of a modification of the second resonator. The second resonator illustrated in FIG. 13 includes a second output terminal 1021, a second reference terminal 1022, a second inner loop wiring 1023, a second short-circuit via 1028, and a second grand via 1029. In the case of the structure described above with reference to FIG. 4, the second inner loop wiring 123 is electrically connected to the second outer loop wiring 124 via the second short-circuit wiring 126 thereby being short-circuited thereto. On the other hand, in the structure illustrated in FIG. 13, the second inner loop wiring 1023 is electrically connected to the back-surface ground through the second short-circuit via 1028 thereby being short-circuited thereto. In this structure, the second inner loop wiring 1023 is a wiring having two ends one of which is a second open end 1027 and the other one is the second short-circuit via 1028. the second short-circuit via 1028 may be formed of, for example, a metal such as gold. In the example illustrated in FIG. 13, the second reference terminal 1022 is electrically connected to the back-surface ground through the second grand via 1029. The second grand via 1029 may be formed of, for example, a metal such as gold. In the third resonator, as with the example of the modification of the second resonator illustrated in FIG. 13, the third inner loop wiring may be electrically connected to the upper-surface ground via the third short-circuit via (not illustrated), and the third output terminal may be electrically connected to the upper-surface ground through the third grand via (not illustrated).

Figure 14:
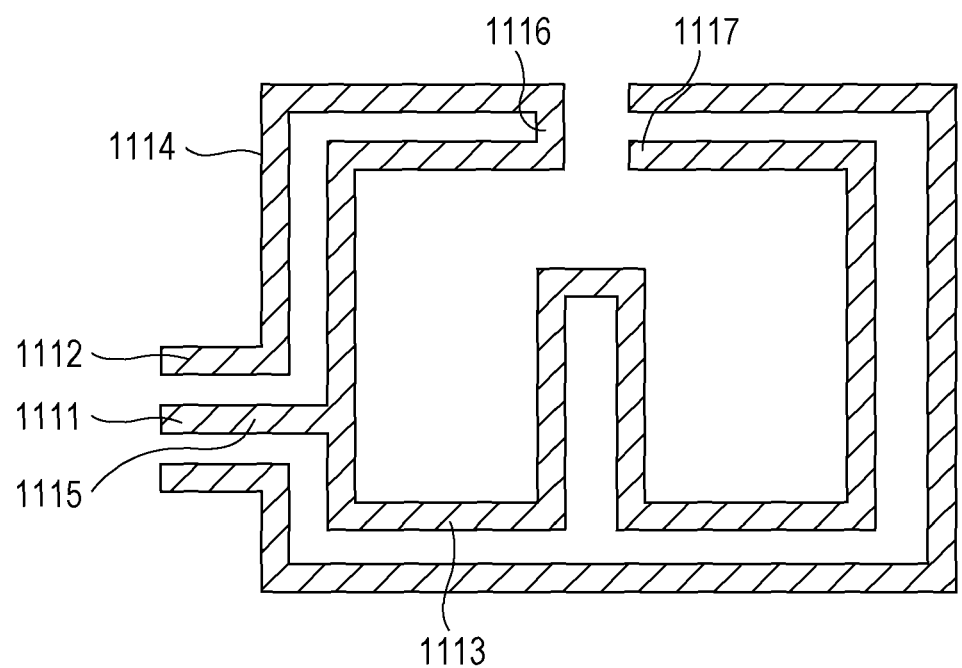
FIG. 14 is a top view illustrating a first modified example of a first resonance coupler.

FIG. 14 illustrates a first example of a modification of the first resonator. The first resonator illustrated in FIG. 14 includes a first input terminal 1111, a first reference terminal 1112, a first input wiring 1115, a first inner loop wiring 1113, a first short-circuit wiring 1116, and a first outer loop wiring 1114. In FIG. 14, the first outer loop wiring 1114 is partially cut out at a location close to a connection unit to the first short-circuit wiring 1116. In other words, the first outer loop wiring 1114 illustrated in FIG. 14 has an end part at a location opposed to a first open end 1117 of the first inner loop wiring 1113. Similarly, a second outer loop wiring may be partially cut out at a location close to a second short-circuit wiring, and a third outer loop wiring may be partially cut out at a location close to a third short-circuit wiring.

Figure 15:
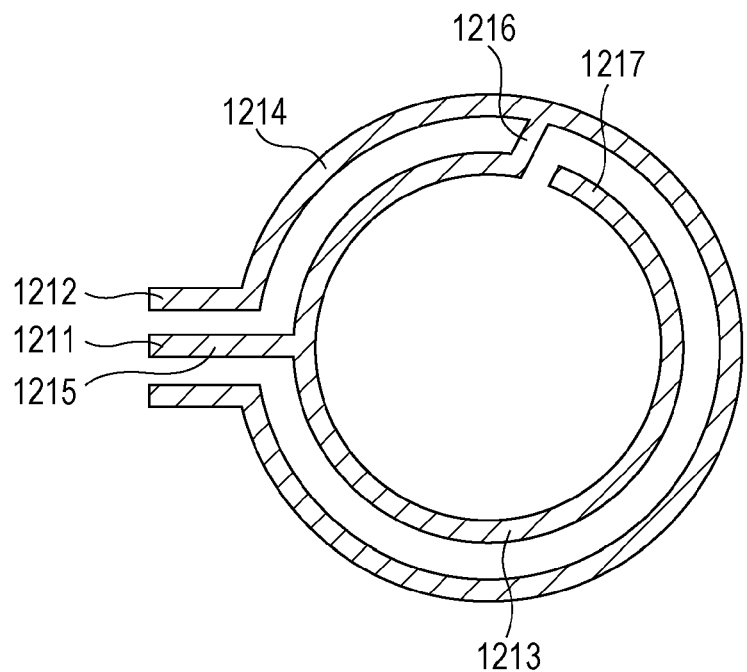
FIG. 15 is a top view illustrating a second modified example of the first resonance coupler.

FIG. 15 illustrates a second example of a modification of the first resonator. The first resonator illustrated in FIG. 15 includes a first input terminal 1211, a first reference terminal 1212, a first input wiring 1215, a first inner loop wiring 1213, a first short-circuit wiring 1216, and a first outer loop wiring 1214. One end of the first inner loop wiring 1213 is a first open end 1217. As illustrated in FIG. 15, the first inner loop wiring 1213 and the first outer loop wiring 1214 each have a circular shape. Similarly, a second inner loop wiring, a second outer loop wiring, a third inner loop wiring, and a third outer loop wiring each may have a circular shape.

Figure 16:
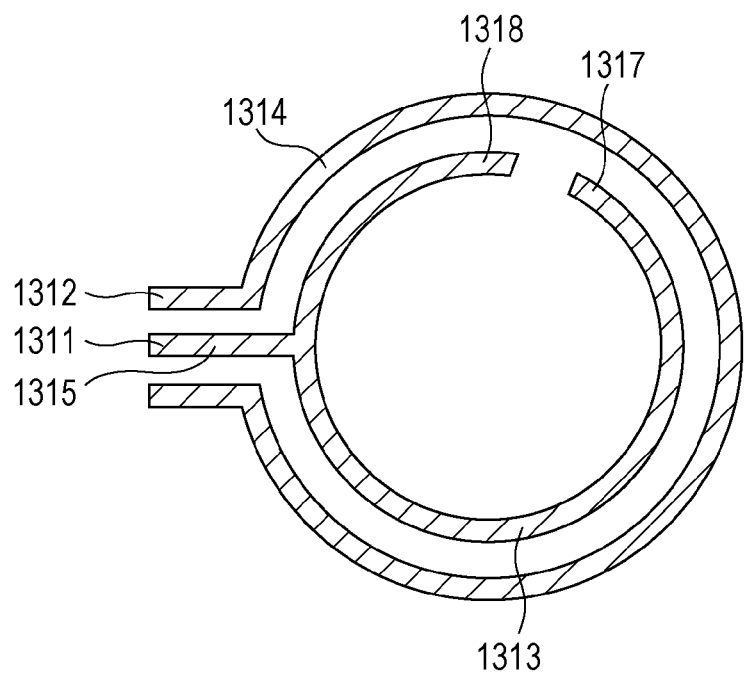
FIG. 16 is a top view illustrating a third modified example of the first resonance coupler.

FIG. 16 illustrates a third example of a modification of the first resonator. The first resonator illustrated in FIG. 16 includes a first input terminal 1311, a first reference terminal 1312, a first input wiring 1315, a first inner loop wiring 1313, and a first outer loop wiring 1314. The first inner loop wiring 1313 illustrated in FIG. 16 are open at both ends. More specifically, the first inner loop wiring 1313 has a first open end 1317 and a fourth open end 1318. In this structure, the writing length from the first open end 1317 to the fourth open end 1318 is equal to about one-half an equivalent wavelength of an operating frequency of the resonance coupler 100. Similarly, a second inner loop wiring and a third inner loop wiring may be open at both ends of each wiring.

Figure 17:
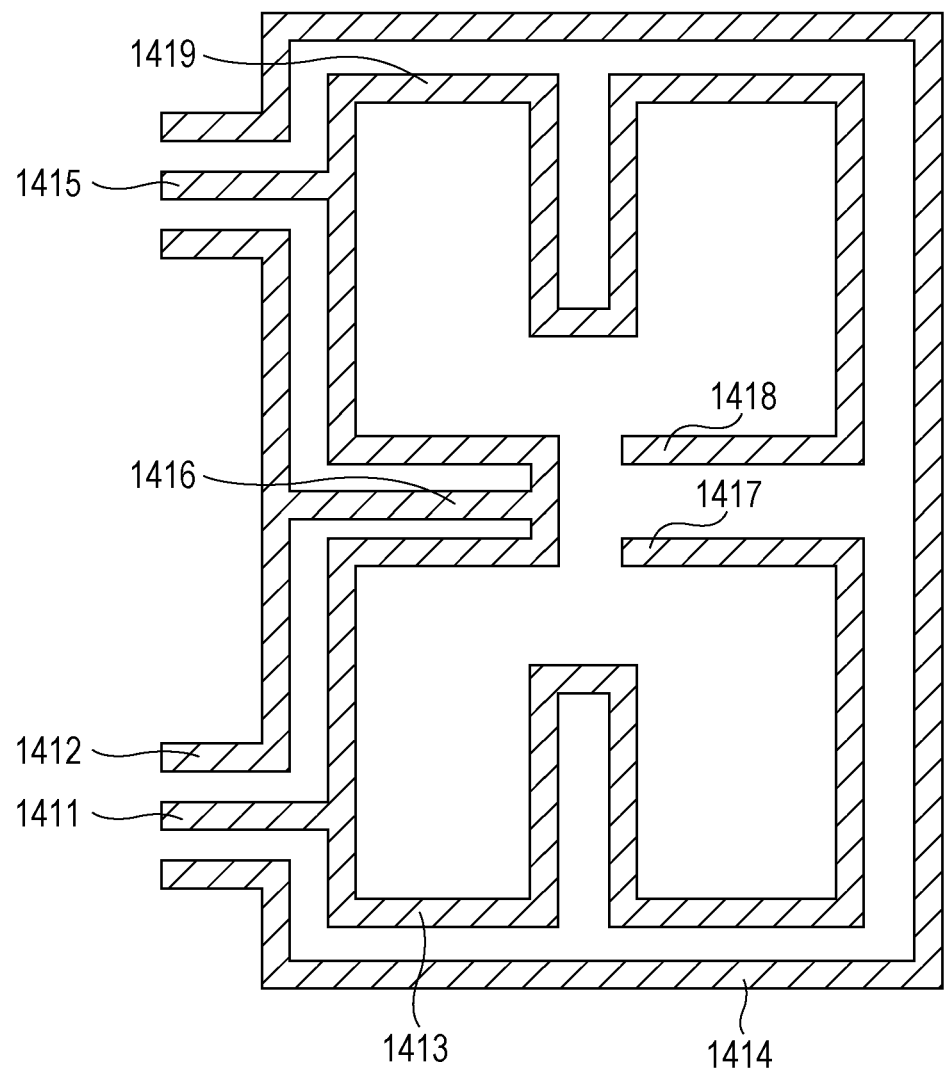
FIG. 17 is a top view illustrating a fourth modified example of the first resonance coupler.

FIG. 17 illustrates a fourth example of a modification of the first resonator. The first resonator includes a first inner loop wiring 1413, a fourth inner loop wiring 1419, and an outer loop wiring 1414 surrounding the first inner loop wiring 1413 and the fourth inner loop wiring 1419. In the example illustrated in FIG. 17, the first inner loop wiring 1413 and the fourth inner loop wiring 1419 are disposed such that they are line-symmetric about a line of the first short-circuit wiring 1416. The outer loop wiring 1414 is connected to the first short-circuit wiring 1416. In the first inner loop wiring 1413, one end thereof is a first open end 1417, and the other end is connected to the first short-circuit wiring 1416. The first short-circuit wiring 1416 is electrically connected to the first reference terminal 1412. In the fourth inner loop wiring 1419, one end thereof is a fourth open end 1418, and the other end is connected to the first short-circuit wiring 1416. The first inner loop wiring 1413 is electrically connected to the first input terminal 1411, and the fourth inner loop wiring 1419 is electrically connected to the fourth input terminal 1415. That is, the first resonator illustrated in FIG. 17 includes two input terminals. In a case where a second resonator and a third resonator also have an identical structure, the resonance coupler 100 has two input terminals and four output terminals.

Figure 18:
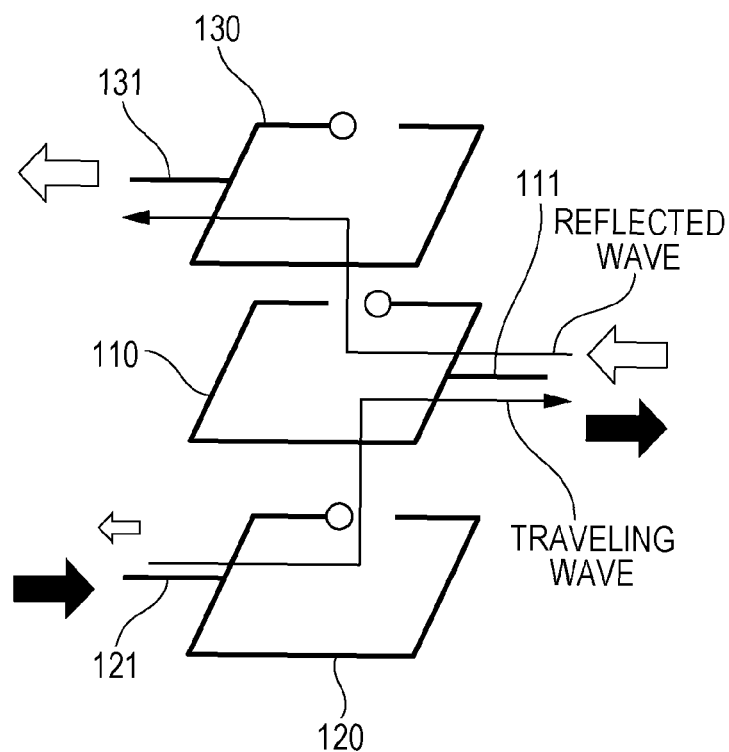
FIG. 18 is schematic diagram illustrating flows of signals through a directional coupler.

In the above description, it has been explained for a case where the resonance coupler 100 operates such that the high-frequency signal input from the first input terminal 111 is output from the second output terminal 121 and the third output terminal. However, the resonance coupler 100 is capable of operating bidirectionally. That is, in the resonance coupler 100, for example, signals input from the second output terminal 121 and the third output terminal 131 may be output from the first input terminal 111. Alternatively, a signal input from the second output terminal 121 may be output from the third output terminal 131 or the first input terminal 111. For example, as illustrated in FIG. 18, the resonance coupler 100 may be used as a directional coupler having an isolation function. In the resonance coupler illustrated in FIG. 18, a signal input from the second output terminal 121 is isolatedly transmitted to the first resonator 110 and then output from the first input terminal 111. Furthermore, a signal input from the first input terminal 111 is isolatedly transmitted to the third resonator 130 and then output from the third output terminal 131. The signal input from the first input terminal 111 is, for example, a signal reflected back from a circuit connected to the first input terminal 111.

In conventional directional couplers, it is difficult to obtain a high withstand voltage. This is because one ground is used in common, and/or because a good characteristic is not obtained unless the wiring space is small enough. In contrast, the resonance coupler according to the embodiment can be used to realize a directional coupler having a high isolation function.

The distance between the first resonator and the second resonator may be equal to the distance between the first resonator and the third resonator. Alternatively, the distance between the first resonator and the second resonator may be greater than the distance between the first resonator and the third resonator. In this case, most of the signal input from the second output terminal 121 is output from the first input terminal 111, and most of the signal input from the first input terminal 111 is output from the third output terminal 131.

The present disclosure is not limited to the embodiments or modifications thereof described above. It will be apparent to those skilled in the art that many various modifications may be applicable to the embodiments or the modifications described above without departing from the spirit and scope of the present disclosure. Furthermore, constituent elements of different embodiments or modifications may be combined. In this case, any resultant combination also falls within the scope of the present disclosure. The resonance coupler according to the present disclosure may be used, for example, in insulated power splitter, directional couplers, insulated gate driving circuits, and the like.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A resonance coupler comprising:
    a first resonator to which a transmission signal is input;
    a second resonator to which the transmission signal is isolatedly transmitted from the first resonator, the second resonator spaced from and opposed to a first side of the first resonator, and electromagnetically coupled with the first resonator; and
    a third resonator to which the transmission signal is isolatedly transmitted from the first resonator, the third resonator spaced from and opposed to a second side, opposite to the first side, of the first resonator, electromagnetically coupled with the first resonator, and DC-isolated from the second resonator,
    wherein the transmission signal is a high-frequency signal,
    the first resonator includes a first loop wiring having an open loop shape,
    the second resonator includes a second loop wiring having an open loop shape,
    the third resonator includes a third loop wiring having an open loop shape,
    the first resonator includes a first reference terminal electrically connected to one end of the first loop wiring,
    the second resonator includes a second reference terminal electrically connected to one end of the second loop wiring,
    the third resonator includes a third reference terminal electrically connected to one end of the third loop wiring, and
    the first resonator further includes a first outer loop wiring surrounding the first loop wiring, the first outer loop electrically connected to the first reference terminal.

2. The resonance coupler according to claim 1, wherein the second resonator is disposed in a second plane area, the first resonator is disposed in a first plane area, the third resonator is disposed in a third plane area, and the second plane area, the first plane area, and the third plane area are overlaid in this order.

3. The resonance coupler according to claim 2, further comprising:
    a first substrate on which the second plane area is located;
    a second substrate on which the first plane area is located; and
    a third substrate on which the third plane area is located,
    wherein the first substrate, the second substrate and the third substrate are laminated in this order.

4. The resonance coupler according to claim 1, wherein the second resonator is spaced from the first resonator by a distance equal to or less than twice a loop length of the first loop wiring, and
    the third resonator is spaced from the first resonator by a distance equal to or less than twice the loop length of the first loop wiring.

5. The resonance coupler according to claim 1, wherein the first loop wiring, the second loop wiring, and the third loop wiring have an identical shape.

6. The resonance coupler according to claim 1, wherein the first resonator includes an input terminal electrically connected to the first loop wiring,
    the second resonator includes an output terminal electrically connected to the second loop wiring, and
    the third resonator includes another output terminal electrically connected to the third loop wiring.

7. The resonance coupler according to claim 1, wherein:
    the first loop wiring is in a first plane area, the first outer loop wiring surrounding the first loop wiring in the first plane area and electrically connected to the first loop;
    the second resonator includes a second loop wiring having an open loop shape in a second plane area, a second outer loop wiring surrounding the second loop wiring in the second plane area and electrically connected to the second loop, and the second reference terminal electrically connected to the second outer loop;
    the third resonator includes a third loop wiring having an open loop shape in a third plane area, a third outer loop wiring surrounding the third loop wiring in the third plane area and electrically connected to the third loop, and the third reference terminal electrically connected to the third outer loop; and
    the second plane area, the first plane area and the third plane area are overlaid in this order.

8. The resonance coupler according to claim 1, further comprising a first ground part that opposes a side of the second resonator, the side not opposing the first resonator, and that covers the second loop wiring.

9. The resonance coupler according to claim 1, further comprising a second ground part that opposes a side of the third resonator, the side not opposing the first resonator, and that covers the third loop wiring.

10. The resonance coupler according to claim 1, further comprising:
    a first ground part that opposes a side of the second resonator, the side not opposing the first resonator, and that covers the second loop wiring;

a second ground part that opposes a side of the third resonator, the side not opposing the first resonator, and that covers the third loop wiring, and wherein the first ground part is electrically connected to the second reference terminal, and the second ground part is electrically connected to the third reference terminal.

11. The resonance coupler according to claim 1, wherein the distance between the first resonator and the second resonator is different from the distance between the first resonator and the third resonator.

12. A transmission apparatus comprising:
a resonance coupler comprising:
  a first resonator to which a transmission signal is input;
  a second resonator to which the transmission signal is isolatedly transmitted from the first resonator, the second resonator spaced from and opposed to a first side of the first resonator, and electromagnetically coupled with the first resonator; and
  a third resonator to which the transmission signal is isolatedly transmitted from the first resonator, the third resonator spaced from and opposed to a second side, opposite to the first side, of the first resonator, electromagnetically coupled with the first resonator, and DC-isolated from the second resonator;
a transmission circuit that generates a high-frequency signal by modulating a high frequency wave according to an input signal and transmits the high-frequency signal as the transmission signal to the first resonator; and
a reception circuit that receives the transmission signal from the second resonator and the third resonator and generates an output signal by rectifying the transmission signal.

13. A matrix converter comprising:
an integrated transmission circuit in which at least three transmission circuits are integrated;
an integrated isolation device in which at least nine resonance couplers are integrated; and
an integrated power device in which at least nine reception circuits and at least nine bidirectional switches corresponding to the at least nine reception circuits are integrated,
wherein the at least nine bidirectional switches are driven according to at least nine input signals applied to the integrated transmission circuit;
one of the at least three transmission circuits generates a high-frequency signal by modulating a high frequency wave according to one of the at least nine input signals;
one of the at least nine resonance couplers includes:
  a first resonator to which the high-frequency signal is input from the one of the at least three transmission circuits,
  a second resonator to which the high-frequency signal is isolatedly transmitted from the first resonator, the second resonator spaced from and opposed to a first side of the first resonator, and electromagnetically coupled with the first resonator, and
  a third resonator to which the high-frequency signal is isolatedly transmitted from the first resonator, the third resonator spaced from and opposed to a second side, opposite to the first side, of the first resonator, and electromagnetically coupled with the first resonator, one of the at least nine reception circuits receives the high-frequency signal from the second resonator and the third resonator and generates an output signal by rectifying the high-frequency signal; and one of the at least nine bidirectional switches corresponding to the one of the at least nine reception circuits is controlled by the output signal.

14. The matrix converter according to claim 13, wherein:
each of the at least three transmission circuits generates three high-frequency signals according to corresponding three of the at least nine input signals,
each of the at least nine resonance couplers splits one of the three high-frequency signals input from the integrated transmission circuit into two high-frequency signals, and outputs the two high-frequency signals, and
each of the at least nine reception circuits receives the two high-frequency signals from the integrated isolation device, generates an output signal according to the two high-frequency signals, and outputs the output signal to corresponding one of the bidirectional switches.

15. A directional coupler comprising: a first resonator that generates a reflection signal according to an input signal input, the first resonator including a first loop wiring having an open loop shape in a first plane area; a second resonator to which the transmission signal is isolatedly transmitted from the first resonator, the second resonator spaced from and opposed to a first side of the first resonator, and electromagnetically coupled with the first resonator, the second resonator including a second loop wiring having an open loop shape in a second plane area; and a third resonator to which the transmission signal is isolatedly transmitted from the first resonator, the third resonator spaced from and opposed to a second side, opposite to the first side, of the first resonator, and electromagnetically coupled with the first resonator, the third resonator including a third loop wiring having an open loop shape in a third plane area, wherein the second plane area, the first plane area and the third plane area are overlaid in this order, and the distance between the first resonator and the second resonator is greater than the distance between the first resonator and the third resonator.

16. The directional coupler according to claim 15, wherein:
the transmission signal is a high-frequency signal;
the first resonator further includes a first outer loop wiring surrounding the first loop wiring in the first plane area and electrically connected to the first loop, and a first reference terminal electrically connected to the first outer loop;
the second resonator further includes a second outer loop wiring surrounding the second loop wiring in the second plane area and electrically connected to the second loop, and a second reference terminal, the second outer loop electrically connected to the second outer loop reference terminal; and
the third resonator further includes a third outer loop wiring surrounding the third loop wiring in the third plane area and electrically connected to the third loop, and a third reference terminal, the third outer loop electrically connected to the third outer loop reference terminal.

* * * * *